(12) United States Patent
Ishii

(10) Patent No.: US 8,168,982 B2
(45) Date of Patent: May 1, 2012

(54) SUBSTRATE FOR ELECTRO-OPTICAL DEVICE WITH LIGHT SHIELDING SECTION HAVING VARIOUS WIDTHS, ELECTRO-OPTICAL DEVICE, AND ELECTRONIC APPARATUS

(75) Inventor: Tatsuya Ishii, Chitose (JP)

(73) Assignee: Seiko Epson Corporation, Tokyo (JP)

( * ) Notice: Subject to any disclaimer, the term of this patent is extended or adjusted under 35 U.S.C. 154(b) by 343 days.

(21) Appl. No.: 12/567,268

(22) Filed: Sep. 25, 2009

(65) Prior Publication Data

US 2010/0012979 A1 Jan. 21, 2010

Related U.S. Application Data

(63) Continuation of application No. 11/776,773, filed on Jul. 12, 2007, now abandoned.

(30) Foreign Application Priority Data

Jul. 24, 2006 (JP) .................................. 2006-200896

(51) Int. Cl.
*H01L 29/06* (2006.01)
(52) U.S. Cl. .......................................... 257/72; 349/44
(58) Field of Classification Search .................... 257/59, 257/72; 349/44
See application file for complete search history.

(56) References Cited

U.S. PATENT DOCUMENTS

| | | | |
|---|---|---|---|
| 5,844,282 A | 12/1998 | Noguchi | |
| 5,966,193 A | 10/1999 | Zhang et al. | |
| 6,191,476 B1 | 2/2001 | Takahashi et al. | |
| 6,559,595 B1 | 5/2003 | Inoue | |
| 6,610,997 B2 | 8/2003 | Murade | |
| 6,683,592 B1 | 1/2004 | Murade | |
| 7,064,735 B2 | 6/2006 | Muradw | |
| 7,123,323 B2 | 10/2006 | Honbo et al. | |
| 7,616,275 B2 * | 11/2009 | Ishii | ................................ 349/110 |
| 2001/0022365 A1 | 9/2001 | Murade | |
| 2002/0018278 A1 | 2/2002 | Sato | |
| 2003/0155588 A1 | 8/2003 | Murade | |

(Continued)

FOREIGN PATENT DOCUMENTS

EP 0 569 601 A1 11/1993

(Continued)

*Primary Examiner* — Thomas L Dickey
(74) *Attorney, Agent, or Firm* — Oliff & Berridge, PLC

(57) ABSTRACT

Disclosed is a substrate for an electro-optical device including: a substrate; a plurality of data lines and a plurality of scanning lines which intersect with other on the substrate; a pixel electrode formed in each of a plurality of pixels which configure a display region on the substrate and are defined in correspondence with intersections between the plurality of data lines and the plurality of scanning lines; a transistor provided in each of non-opening regions which discriminate between opening regions of the plurality of pixels and including a semiconductor layer including a channel region having a channel length in one direction of the display region, a data line side source/drain region electrically connected to the data line, a pixel electrode side source/drain region electrically connected to the pixel electrode, a first junction region formed between the channel region and the data line side source/drain region, and a second junction region formed between the channel region and the pixel electrode side source/drain region; and a light-shielding section which is formed above each of the semiconductor layers, extends along the one direction, and includes a first portion which covers the first junction region and a second portion which covers the second junction region and has a width larger than that of the first portion in a direction intersecting the one direction.

8 Claims, 13 Drawing Sheets

U.S. PATENT DOCUMENTS

| | | |
|---|---|---|
| 2008/0048190 A1 | 2/2008 | Ishii |
| 2008/0186422 A1 | 8/2008 | Ishii |

FOREIGN PATENT DOCUMENTS

| | | | |
|---|---|---|---|
| JP | A 2001-330859 | 11/2001 | |
| JP | A 2001-356371 | 12/2001 | |
| JP | A 2003-262888 | 9/2003 | |
| JP | A 2004-4722 | 1/2004 | |
| JP | A 2004-340981 | 12/2004 | |
| JP | B2 3731447 | 10/2005 | |
| JP | A 2005-338876 | 12/2005 | |
| KR | B1 10-0402506 | 10/2003 | |

* cited by examiner

SUBSTRATE FOR ELECTRO-OPTICAL DEVICE WITH LIGHT SHIELDING SECTION HAVING VARIOUS WIDTHS, ELECTRO-OPTICAL DEVICE, AND ELECTRONIC APPARATUS

CROSS-REFERENCE TO RELATED APPLICATION

This is a Continuation of application Ser. No. 11/776,733, filed on Jul. 12, 2007, which in turn claims priority from Japanese Patent Application No. 2006-200896 filed in the Japanese Patent Office on Jul. 24, 2006, the entire disclosure of which is hereby incorporated by reference in its entirety.

BACKGROUND

1. Technical Field

The present invention relates to a substrate for an electro-optical device used in an electro-optical device such as a liquid crystal device, an electro-optical device including the substrate for the electro-optical device, and an electro-optical apparatus including the electro-optical device, such as a liquid crystal projector.

2. Related Art

A liquid crystal device which is an example of an electro-optical device is, for example, used as an optical modulation unit (a light valve) of a projection type display device as well as a direct view type display. In particular, in the projection type display device, since strong light from a light source is input to a liquid crystal light valve, a light-shielding film is mounted in the liquid crystal light valve as a light-shielding section for blocking incident light such that a thin-film transistor (TFT) in the liquid crystal light valve does not cause the increase of leak current or malfunction by the light. With respect to the light-shielding section or the light-shielding film, for example, JP-A-2004-4722 discloses a technology of shielding light by a scanning line functioning as a gate electrode in a channel region of a TFT. According to Japanese Patent No. 3731447, light which reaches a channel region of a TFT is reduced by providing a plurality of light-shielding films formed on the channel region and a layer for absorbing inner reflection light. JP-A-2003-262888 discloses a technology of significantly reducing incident light input to a channel region of a TFT while narrowing scanning lines and ensuring a suitable operation of the TFT.

Meanwhile, in such an electro-optical device, retention capacitors for holding the charges of pixel electrodes for a predetermined time period by temporarily holding image signals supplied to the pixel electrodes are provided on a region in which a light-shielding film is formed on a substrate, that is, a region of the substrate which does not transmit light. Such retention capacitors may shield TFTs from light by using electrodes, which are the component of the retention capacitors, as a light-shielding film.

However, for example, when light is irradiated to a junction region, such as a lightly doped drain (LDD) region, formed between a channel region and source and drain regions, light leak current occurs in the junction region. In order to solve such a problem, a light-shielding section may be provided on the junction regions of the both sides of the channel region. However, narrowing of an opening region which substantially transmits light in a pixel is not preferable in view of display performance. Meanwhile, the present inventor observes that, when light is irradiated to a junction region formed between the source and drain regions and the channel region connected to the pixel electrode, light leak current is easy to occur in the TFT, compared with a case where light is irradiated to a junction region formed between the source and drain regions and the channel region connected to a data line.

SUMMARY

Exemplary embodiments of the invention include a substrate for an electro-optical device used in an electro-optical device, an electro-optical device including the substrate for the electro-optical device, and an electro-optical apparatus, which are capable of efficiently reducing occurrence of light leak current in a TFT while realizing a high numerical aperture as an electro-optical device, such as a liquid crystal device, driven by an active matrix method.

According to a first exemplary embodiment, there is provided a substrate for an electro-optical device including: a substrate; a plurality of data lines and a plurality of scanning lines which intersect with other on the substrate; a pixel electrode formed in each of a plurality of pixels which configure a display region on the substrate and are defined in correspondence with intersections between the plurality of data lines and the plurality of scanning lines; a transistor provided in each of non-opening regions which discriminate between opening regions of the plurality of pixels and including a semiconductor layer including a channel region having a channel length in one direction of the display region, a data line side source/drain region electrically connected to the data line, a pixel electrode side source/drain region electrically connected to the pixel electrode, a first junction region formed between the channel region and the data line side source/drain region, and a second junction region formed between the channel region and the pixel electrode side source/drain region; and a light-shielding section which is formed above each of the semiconductor layers, extends along the one direction, and includes a first portion which covers the first junction region and a second portion which covers the second junction region and has a width larger than that of the first portion in a direction intersecting the one direction.

According to the substrate for the electro-optical device according to the first exemplary embodiment, an image signal from the data line to the pixel electrode is controlled and thus an image display is possible by a so-called active matrix method. The image signal is supplied from the data line to the pixel electrode via a transistor at a predetermined timing by turning on/off the transistor electrically connected between the data line and the pixel electrode. The pixel electrode is a transparent electrode made of a transparent conductive material such as indium tin oxide (ITO) and is provided in plural in a matrix in a display region of the substrate in correspondence with the intersection between the data line and the scanning line.

The transistor includes the semiconductor layer having the channel region, the data line side source/drain region, and the pixel electrode side source/drain region. For example, the gate electrode overlaps the channel region. The transistor is provided in each of the non-opening regions which discriminate between the opening regions of the plurality of pixels. Here, the "opening region" in some embodiments is the region in the pixel through which light substantially transmits, for example, the region in which the pixel electrode is formed and the gray scales of the light emitted from an electro-optical material such as liquid crystal can be changed according to a variation in transmittance ratio. In other words, the "opening region" indicates a region through which the light focused to the pixel transmits or a region in which the light is not blocked by a light-shielding body having a transmittance ratio lower than that of a transparent electrode, such as a wiring line, a light-shielding film, and a variety of elements. The "non-opening region" related to some embodiments indicates a region through which light contributing to the display does not transmits, for example, a region in which the light-shielding body, such as a non-transparent wiring line or an electrode or a variety of elements, is provided in the pixel.

The channel region has the channel length along one direction in the display region. The "one direction" in some embodiments indicates a row direction of the plurality of pixels defined in a matrix on the substrate, that is, the arrangement direction of the plurality of data lines or a direction (that is, a X direction) in which the plurality of scanning lines extends, or a column direction of the plurality of pixels defined in a matrix on the substrate, that is, the arrangement direction of the plurality of scanning lines or a direction (that is, a Y direction) in which the plurality of data lines extends.

The data line side source/drain region is electrically connected to the data line and the pixel electrode side source/drain region is electrically connected to the pixel electrode. The first junction region is formed between the data line side source/drain region and the channel region of the semiconductor and the second junction region is formed between the pixel electrode side source/drain region and the channel region of the semiconductor layer. The first junction region is a region formed in the junction portion between the channel region and the data line side source/drain region and the second junction is a region formed in the junction region between the channel region and the pixel electrode side source/drain region. That is, the first and second junction regions indicates a PN junction region when the transistor, for example, a PNP-type or an NPN-type transistor (that is, an N-type or P-type transistor) is formed or an LDD region (that is, an impurity region obtained by implanting impurities into the semiconductor layer by impurity implantation such as an ion implantation) when the transistor has an LDD structure.

The light-shielding section is formed above the semiconductor layer to cover the semiconductor layer in a lamination structure on the substrate. The light-shielding section may have an extending portion which extends along the other direction intersecting one direction in the non-opening region. The light-shielding section may be a film-shaped light-shielding body including a single layer or a plurality of layers having a light-shielding property, such as a light-shielding film, or various types of elements including an electrode having a light-shielding property. The light-shielding section has the first portion for covering the first junction region and a second portion for covering the second junction region. Accordingly, it is possible to shield the first and second portion from the light input from the upper layer side to the first and second junction regions. Accordingly, it is possible to reduce the occurrence of light leak current in the first and second junction regions.

In embodiments of the present invention, in particular, in the light-shielding section, the second for covering the second junction region has the width larger than that of the first portion for covering the first junction region in the other direction intersecting one direction. That is, the second portion has, for example, the X-direction width larger than that of the first portion with respect to the semiconductor layer which extends, for example, along the Y direction. In other words, the second portion has the extending portion which extends along the other direction by a length larger than that of the first portion. Accordingly, it is possible to more reliably block the light input to the second junction region, compared with the light input to the first junction region. That is, the light-shielding effect for blocking the light which reaches the second junction region can be more improved (enhanced) than the light-shielding effect for blocking the light which reaches the first junction region. Here, the present inventor observes that, at the time of the operation of the transistor, in the second junction region, the light leak current is easy to occur, compared with the first junction region. Accordingly, when the second portion has a width larger than that of the first portion, it is possible to improve the light-shielding effect of the second junction region in which the light leak current is easy to occur and the light leak current flowing in the transistor can be efficiently reduced. Conversely, when the first portion for covering the first junction region in which the light leak current is hard to occur compared with the second junction region has a width smaller than that of the second portion, it is possible to prevent a numerical aperture from being vainly reduced.

That is, it is possible to improve the light-shielding effect of the second junction region in which the light leak current is easy to occur when the width of the second portion increase and it is possible to prevent the numerical aperture from being vainly reduced when the width of the first portion decreases. That is, by increasing the light-shielding effect of the second junction region in which the light leak current is easy to occur, that is, a pinpoint, it is possible to efficiently reduce the light leak current in the transistor without vainly reducing the numerical aperture. Here, the "numerical aperture" indicates a ratio of the opening region to the pixel including the opening region and the non-opening region in size. As the numerical aperture increases, the display performance of the electro-optical device including the substrate for the electro-optical device is improved.

As described above, according to the substrate for the electro-optical device of the first exemplary embodiment, it is possible to provide an electro-optical device capable of reducing a display failure such as flicker due to the occurrence of the light leak current without vainly reducing the numerical aperture.

In the substrate for the electro-optical device according to the first exemplary embodiment, the second junction region may be an LDD region.

According this aspect, the transistor has the LDD structure. Accordingly, it is possible to reduce off current flowing in the data line side source/drain region and the pixel electrode side source/drain region at the time of the non-operation of the transistor and to suppress the reduction of on current which flows at the time of the operation of the transistor.

In the substrate for the electro-optical device according to the first exemplary embodiment, the light-shielding section may be positioned on the transistor.

According to this aspect, it is possible to further reduce incident light which is obliquely input to the semiconductor layer between the light-shielding section and the transistor in the lamination structure on the substrate. More particularly, since the lamination-direction distance between the light-shielding section and the transistor decreases compared with a case where a light-shielding film other than the light-shielding section is interposed between the light-shielding section and the transistor, it is possible to block the light, which is obliquely input to the semiconductor layer at a large angle with respect to a direction normal to the semiconductor layer, by the light-shielding section.

In the substrate for the electro-optical device according to the first exemplary embodiment, the light-shielding section may be a capacitive element having a pair of capacitive electrodes and a dielectric film interposed between the pair of capacitive electrodes, and the capacitive element may hold the voltage of the pixel electrode when an image signal is supplied to the pixel electrode via the data line.

According to this aspect, the capacitive element is a retention capacitor for temporarily holding the voltage of the pixel electrode. Since the capacitive element is also used as the light-shielding section, it is possible to simplify the layout of wiring lines configuring a circuit and a circuit arrangement on the substrate for the electro-optical device, compared with a case of separately providing a light-shielding film.

In some embodiments in which the light-shielding section is the capacitive element, at least one of the pair of capacitive electrodes includes a conductive light-shielding film.

According this aspect, it is possible to reliably shield the semiconductor from the light input from the upper layer side by the capacitive element closely positioned on the transistor with the interlayer insulating film interposed therebetween. As a conductive light-shielding film, metal containing at least one of high melting point metal such as titanium (Ti), chrome (Cr), tungsten (W), tantalum (Ta), and molybdenum (Mo), an alloy thereof, metal silicide, polysilicide, or a lamination thereof may be used.

According to a second exemplary embodiment, there is provided a substrate for an electro-optical device including: a substrate; a plurality of data lines and a plurality of scanning lines which intersect with other on the substrate; a pixel electrode formed in each of a plurality of pixels which configure a display region on the substrate and are defined in correspondence with intersections between the plurality of data lines and the plurality of scanning lines; a plurality of transistors each including i) a semiconductor layer having a channel region having a channel length in a first direction in a first region which extends along the first direction in the display region of one of non-opening regions which discriminate between opening regions of the plurality of pixels, a data line side source/drain region electrically connected to the data line, a pixel electrode side source/drain region electrically connected to the pixel electrode, a first junction region formed between the channel region and the data line side source/drain region, and a second junction region formed between the channel region and the pixel electrode side source/drain region, and ii) a gate electrode which overlaps the channel region in an intersection region in which the first region and a second region extending along a second direction intersecting the first direction in the non-opening region; and a light-shielding section which is formed above each of the semiconductor layers and includes first and second portions which respectively extend in the first and second directions and an intersection portion in which the first portion and the second portion intersect with each other in the intersection region.

According to the substrate for the electro-optical device according to the second exemplary embodiment, the same image display as the substrate for the electro-optical device according to the first exemplary embodiment is possible.

The transistor includes the semiconductor layer including the channel region and the gate electrode which overlaps the channel region. The channel region has the channel length along the first direction in the first region which extends along the first direction in the display region of each of the non-opening regions which discriminate between the opening regions of the plurality of pixels. Here, the "first region" is a region which extends in the first direction of the display region of the non-opening region which extends in a matrix in the display region in order to separate adjacent opening regions. More particularly, the first region is a column direction of the plurality of pixels defined in a matrix on the substrate, that is, the arrangement direction of the plurality of scanning lines. The data lines which intersect the plurality of scanning lines are formed in the first region and the scanning lines are formed in the second region. The semiconductor layer has the first junction region formed between the channel region and the data line side source/drain region and the second junction region formed between the channel region and the pixel electrode side source/drain region. That is, the semiconductor layer has the first junction region formed at the side of the data line side source/drain region and the second junction region formed at the side of the pixel electrode side source/drain region on the basis of the channel region.

The gate electrode overlaps the channel region in the intersection region in which the first region and the second region which extends in the second direction intersecting the first direction in the non-opening region. Here, the "second region" is a region which the scanning line intersecting the data line is positioned in the non-opening region. The gate electrode may be a portion of the scanning line which overlaps the channel region or a conductive film which is provided independent of the scanning line. The conductive film is electrically connected to the scanning line via a connection portion such as a contact hole. The "intersection region" is a region in which the first region and the second region intersect with each other, and more particularly, a region which is located at the middle portion of the opening regions of four adjacent pixels in the non-opening region.

The light-shielding section is formed above the semiconductor layer in the lamination structure on the substrate and has first and second portion which respectively extend in the first and second directions and the intersection portion in which the first portion and the second portion intersect with each other in the intersection region. The first portion may extend to one side of the intersection region along the first direction or extend to the both sides of the intersection region along the first direction. The second portion extends from the intersection region along the second direction. The second portion may extend to the both sides of the intersection region along the second direction or extend to one side of the intersection region. The light-shielding section has a portion which extends in the first and second directions which intersect with each other, on the basis of the intersection portion located in the intersection region. In order to improve the light-shielding effect for blocking the light which reaches the second junction region, it is preferable that the second portion extends to the both sides of the intersection region.

In some embodiments, in particular, at least a portion of the second junction region overlaps the intersection portion in the intersection region. For example, the semiconductor layer may be positioned such that the second junction region overlaps the intersection portion in the intersection region and the first junction region does not overlap the intersection portion. As described above, the present inventor observes that, at the operation of the transistor, in the second junction region, the light leak current is easy to occur, compared with the first junction region. In the intersection portion and the second portion, when at least a portion of the second junction region overlaps the intersection portion, it is possible to reduce the light irradiated to the second junction region, compared with the case where the second junction region does not overlap the intersection portion. More particularly, in the first direction, incident light which is obliquely input to the second junction region at a large angle with respect to a direction normal to the surface along the surface of the first portion is blocked by the first portion, because the first portion extends along the first direction. Meanwhile, in the second direction, incident light which is obliquely input to the second junction region at a large angle with respect to a direction normal to the surface along the surface of the second portion is blocked by the intersection portion and the second portion which extends along the second direction. Accordingly, when the second junction region overlaps the intersection portion, it is possible to improve the light-shielding effect of the second junction region. Accordingly, in order to improve the light-shielding effect of the second junction region in which the light leak current is easy to occur, the width of the first portion or the second portion of the light-shielding section does not need to increase. That is, according to exemplary embodiments of the present invention, the numerical aperture is hardly reduced while the light-shielding effect of the second junction region is improved. In view of the improvement of the numerical aperture, it is preferable that the widths of the first portion and the second portion of the light-shielding section are small. That is, the intersection portion is preferably small. The first junction region in which the light leak current is hard to occur compared with the second junction region does not need to overlap the intersection portion.

As described above, according to the substrate for the electro-optical device of the second exemplary embodiment, it is possible to provide an electro-optical device capable of reducing a display failure such as flicker due to the occurrence of the light leak current without vainly reducing the numerical aperture.

In the substrate for the electro-optical device according to the second exemplary embodiment, the second junction region may be an LDD region.

According this aspect, it is possible to reduce off current flowing in the data line side source/drain region and the pixel electrode side source/drain region at the time of the non-operation of the transistor and to suppress the reduction of on current which flows at the time of the operation of the transistor.

In the substrate for the electro-optical device according to the first exemplary embodiment, the gate electrode may have a main line portion which extends along the second direction in the second region and a convex portion which protrudes from the main line portion to the side of the first junction region along the first direction.

In this aspect, since the channel length is set according to the element characteristics required for the transistor, when the size of the channel region or the length of the semiconductor layer along the channel length is changed such that the second junction region overlaps the intersection portion, the original element characteristics of the transistor is changed. Accordingly, although the occurrence of the light leak current is reduced, the element characteristics such as switching characteristics required for the transistor is changed. Thus, the light leak current can be reduced, but the original element characteristics cannot be obtained. In particular, when the channel length is larger than or equal to the width of the main line portion of the gate electrode, at least a portion of the second junction region overlaps the intersection portion and thus the channel region protrudes from the main line portion along the first direction.

However, according to this aspect, since the gate electrode has the convex portion which protrudes from the main line portion to the side of the first junction region along the first direction, the gate electrode may overlap the channel region although the channel region is shifted to the first junction region along the first direction. In addition, since the convex portion overlaps the first portion which extends along the first direction, the non-opening region does not increase. Accordingly, the gate electrode can overlap the channel region without reducing the numerical aperture.

In the substrate for the electro-optical device according to the second exemplary embodiment, the gate electrode may have a concave portion formed by partially notching the main line portion such that the main line portion does not overlap the second junction region in the intersection region.

According this aspect, it is possible to overlap the second junction region with the center of the intersection portion while the gate electrode does not overlap the second junction region.

In the substrate for the electro-optical device according to the second exemplary embodiment, the light-shielding section may be positioned on the transistor.

According to this aspect, it is possible to reduce incident light which is obliquely input to the semiconductor layer between the light-shielding section and the transistor.

In the substrate for the electro-optical device according to the second exemplary embodiment, the light-shielding section may be a capacitive element having a pair of capacitive electrodes and a dielectric film interposed between the pair of capacitive electrodes, and the capacitive element holds the voltage of the pixel electrode when an image signal is supplied to the pixel electrode via the data line.

According to this aspect, since the capacitive element is also used as the light-shielding section, it is possible to simplify the layout of wiring lines configuring a circuit and a circuit arrangement on the substrate for the electro-optical device, compared with a case of separately providing a light-shielding film.

In some embodiments in which the light-shielding section is the capacitive element, each of the pair of capacitive electrodes may be formed of a metal film.

According to this aspect, the capacitive element has a so-called metal-insulator-semiconductor (MIS) formed by laminating a metal film, a dielectric film (insulating film) and a metal film. According to the capacitive element, it is possible to reduce power consumption of the pair of capacitive electrodes according to various types of signals supplied to the pair of capacitive electrodes. In addition, since the conductivity of the metal film is higher than that of the semiconductor layer, a voltage according to the image signal is immediately supplied to the pixel electrode by supplying the image signal and thus image quality is improved.

In some embodiments in which the light-shielding section is the capacitive element, one of the pair of capacitive electrodes may be formed of semiconductor.

According to this aspect, the capacitive element has a so-called metal-insulator-semiconductor (MIS) formed by laminating a metal film, a dielectric film (insulating film) and a semiconductor film. According to the capacitive element, the semiconductor layer which is one of the capacitive electrodes may be electrically connected to the pixel electrode.

According to a third exemplary embodiment, there is provided an electro-optical device comprising the substrate for the electro-optical device according to the first or second exemplary embodiments.

According to an embodiment of an electro-optical device, since the substrate for the electro-optical device according to the first or second exemplary embodiments is included, it is possible to provide an electro-optical device having excellent display performance.

According to a fourth exemplary embodiment, there is provided an electronic apparatus comprising an electro-optical device.

According to an embodiment of an electronic apparatus, since an electro-optical device included, it is possible to realize various type of electronic apparatuses capable of accomplishing a high-quality display, such as a projection display device, a cellular phone, an electronic organizer, a word processor, a viewfinder-type or direct-view monitor type video tape recorder, a workstation, a videophone, a POS terminal, and a touch panel. It is possible to realize an electromigration device such as an electronic paper as the electronic apparatus.

The above and other operations and advantages of the invention will become more apparent by describing in detail exemplary embodiments.

BRIEF DESCRIPTION OF THE DRAWINGS

Exemplary embodiments of the invention will be described with reference to the accompanying drawings, wherein like numbers reference like elements.

DESCRIPTION OF EXEMPLARY EMBODIMENTS

Hereinafter, a substrate for an electro-optical device, an electro-optical device, and an electronic apparatus according to embodiments of the invention will be described with reference to the accompanying drawings. In the present embodiments, a driving circuit built-in TFT active matrix driving liquid crystal device that is an example of an electro-optical device is taken as an example.

First Embodiment

Figure 1:
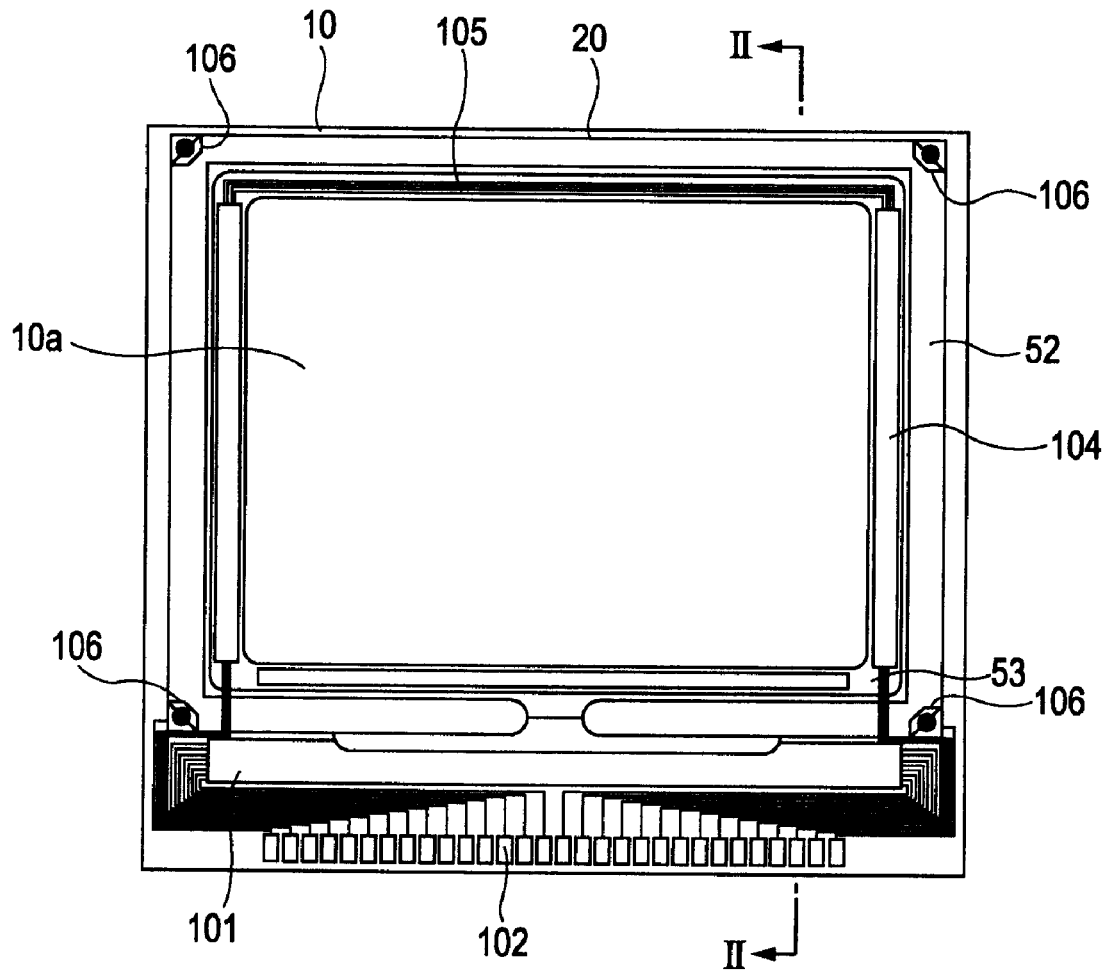
FIG. 1 is a plan view showing the entire configuration of a liquid crystal device according to a first embodiment of the invention.
Figure 2:
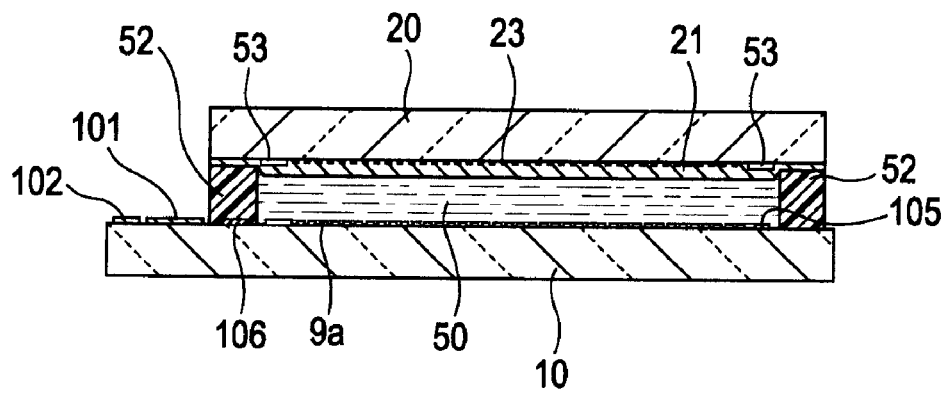
FIG. 2 is a cross-sectional view taken along line II-II of FIG. 1.

First, the entire configuration of the liquid crystal display device according to some embodiments will be described with reference to FIGS. 1 and 2. FIG. 1 is a plan view showing a TFT array substrate of the liquid crystal device and components formed thereon when viewed from a counter substrate side. FIG. 2 is a cross-sectional view taken along line II-II of FIG. 1.

In FIGS. 1 and 2, in the liquid crystal device according to the present embodiment, the TFT array substrate 10 and the counter substrate 20 face each other. A liquid crystal layer 50 is sealed between the TFT array substrate 10 and the counter substrate 20. The TFT array substrate 10 and the counter substrate 20 are attached to each other by a seal material 52 provided in a seal region positioned around an image display region 10a as an example of a "display region" according to some embodiments, in which a plurality of pixel portions is provided.

The seal material 52 is made of a photocurable resin and a thermosetting resin for attaching the two substrates to each other. After coating the TFT array substrate 10 with the seal material 52 during the manufacturing process, the seal material 52 is hardened by radiating ultraviolet rays onto the same and heating the same. Also, in the seal material 52, gap materials, such as glass fibers or glass beads, for setting the distance (the gap between the substrates) between the TFT array substrate 10 and the counter substrate 20 as a predetermined value are dispersed. The liquid crystal device according to some embodiments is a small-sized light valve of a projector, which is suitable for performing enlarged display.

In parallel to the inside of the seal region where the seal material 52 is arranged, a frame light-shielding film 53 having a light-shielding effect, that defines the frame region of the image display region 10a is provided on the side of the counter substrate 20. However, a part or all of the frame light-shielding film 53 may be provided as a built-in light-shielding film on the side of the TFT array substrate 10.

In the peripheral region, the region positioned outside the seal region where the seal material 52 is arranged can include a data line driving circuit 101 and external circuit connection terminals 102, which are provided along one side of the TFT array substrate 10. Scanning line driving circuits 104 are provided along two sides adjacent to the one side so as to be covered with the frame light-shielding film 53. Also, in order to connect with each other the two scanning line driving circuits 104 provided on both sides of the image display region 10a, along the remaining one side of the TFT array substrate 10, a plurality of wiring lines 105 are provided so as to be covered with the frame light-shielding film 53.

On four corners of the counter substrate 20, upper and lower conducting materials 106 functioning as upper and lower conducting terminals between the both substrates are positioned. Meanwhile, on the TFT array substrate 10, upper and lower conducting terminals are provided in the regions facing the corners. By these terminals, the TFT array substrate 10 and the counter substrate 20 are electrically connected to each other.

In FIG. 2, on the TFT array substrate 10, an alignment film can be formed on a pixel electrode 9a after wiring lines such as pixel switching TFTs, scanning lines, and data lines are formed. On the other hand, a light-shielding film 23 in a matrix or in stripes is formed on the counter substrate 20 excluding a counter electrode 21, followed by a topmost layer of alignment film. Also, the liquid crystal layer 50 is made of liquid crystal obtained by mixing one kind or various kinds of nematic liquid crystal with each other and is in a predetermined alignment state between the pair of alignment films.

The TFT array substrate 10 is a transparent substrate such as a quartz substrate, a glass substrate or a silicon substrate. The counter substrate 20 is a transparent substrate, similar to the TFT array substrate 10.

On the TFT array substrate 10, the pixel electrode 9a is provided and the alignment film, which is subjected to a predetermined alignment process such as a rubbing process, is provided thereon. For example, the pixel electrode 9a is made of a transparent conductive film such as ITO and the alignment film is made of an organic film such as a polyimide film.

On the counter substrate 20, the counter electrode 21 is provided over the entire surface and the alignment film 22, which is subjected to a predetermined alignment process such as a rubbing process, is provided thereunder. For example, the counter electrode 21 is made of a transparent conductive film such as ITO and the alignment film 22 is made of an organic film such as a polyimide film.

On the counter substrate 20, a light-shielding film in a matrix or in stripes may be provided. By this configuration, it is possible to more reliably prevent incident light from the TFT array substrate 10 from entering a channel region 1a' and the periphery thereof, together with the upper light-shielding film provided as the below-described upper capacitive electrode 300.

By this configuration, the liquid crystal layer 50 is formed between the TFT array substrate 10 and the counter substrate 20 such that the pixel electrode 9a and the counter electrode 21 face each other. The liquid crystal layer 50 has a predetermined alignment state by the alignment film in a state that an electric field from the pixel electrode 9a is not applied.

On the TFT array substrate 10 shown in FIGS. 1 and 2, in addition to the driving circuits such as the data line driving circuit 101 and the scanning line driving circuits 104, a sampling circuit for sampling and supplying image signals of the image signal lines to the data lines, a precharge circuit for supplying precharge signals having a predetermined voltage level to the plurality of data lines prior to the image signals, and a test circuit for testing the quality and defect of the electro-optical device during manufacturing or before shipment may be formed.

Figure 3:
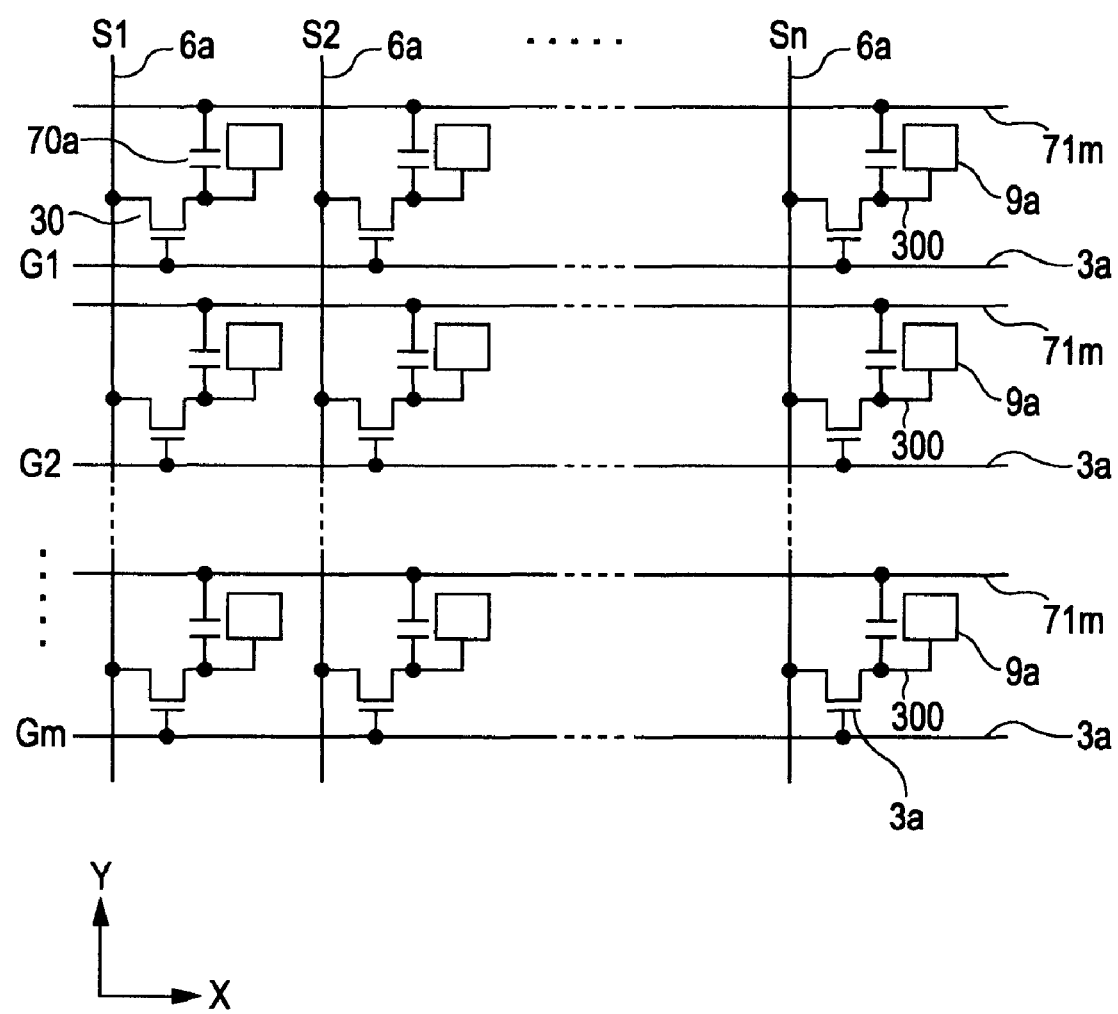
FIG. 3 is an equivalent circuit diagram of a plurality of pixel portions of the liquid crystal device according to the first embodiment of the invention.

Next, the electrical connection of the pixel portions of the liquid crystal device according to the present embodiment will be described with reference to FIG. 3. FIG. 3 is an equivalent circuit diagram of various elements and wiring lines in a plurality of pixels formed in a matrix, which constitute the image display region of the electro-optical device according to the present embodiment.

In FIG. 3, pixel electrodes 9a and TFTs 30 which are an example of a "transistor" are provided in the plurality of pixels formed in a matrix in the image display region 10a, respectively. The TFTs 30 are electrically connected to the pixel electrodes 9a, for switch controlling the pixel electrodes 9a at the time of operating the liquid crystal device. Data lines 6a to which image signals are supplied are electrically connected to the sources of the TFTs 30. The image signals S1, S2, . . . , and Sn written to the data lines 6a may be linearly and sequentially supplied in this order or may be supplied to every group including the plurality of adjacent data lines.

In addition, the scanning lines 3a are electrically connected to the gates of the TFTs 30 and the liquid crystal device 1 is configured to apply linearly and sequentially scanning signals G1, G2, . . . , and Gm to the scanning lines 3a in pulse at a predetermined timing. The pixel electrodes 9a are electrically connected to the drains of the TFTs 30 so as to write the image signals S1, S2, . . . , and Sn supplied from the data lines 6a at a predetermined timing by switching off the switches of the TFTs 30 that are switching elements for only a predetermined period of time. The image signals S1, S2, . . . , Sn of a predetermined level, which are written in the liquid crystal as an example of an electro-optical material through the pixel electrodes 9a are held between the pixel electrodes and the counter electrodes 21 formed on the counter substrate for a predetermined period.

In the liquid crystal of the liquid crystal layer 50, the alignment or the order of molecular association changes in accordance with the level of an applied voltage, thereby being able to modulate light and to display gray scales. In case of a normally white mode, the transmittance ratio of incident light decreases in accordance with the voltage applied in each pixel portion, while in case of a normally black mode, the transmittance ratio of incident light increases in accordance with the voltage applied to each pixel portion. Therefore, light having contrast in proportion to the image signals emits from the electro-optical device as a whole. Here, in order to prevent the held image signals from leaking, storage capacitors 70 which are an example of the "light-shielding section" are additionally provided in parallel to the liquid crystal capacitors formed between the pixel electrodes 9a and the counter electrodes. The storage capacitors 70a function as a retention capacitor for temporarily holding the charges of each pixel electrode 9a by supplying the image signals. The storage capacitors 70 improve the charge holding characteristics of the pixel electrodes 9a and improve the display characteristics such as the improvement of contrast and the reduction of flicker.

Figure 4:
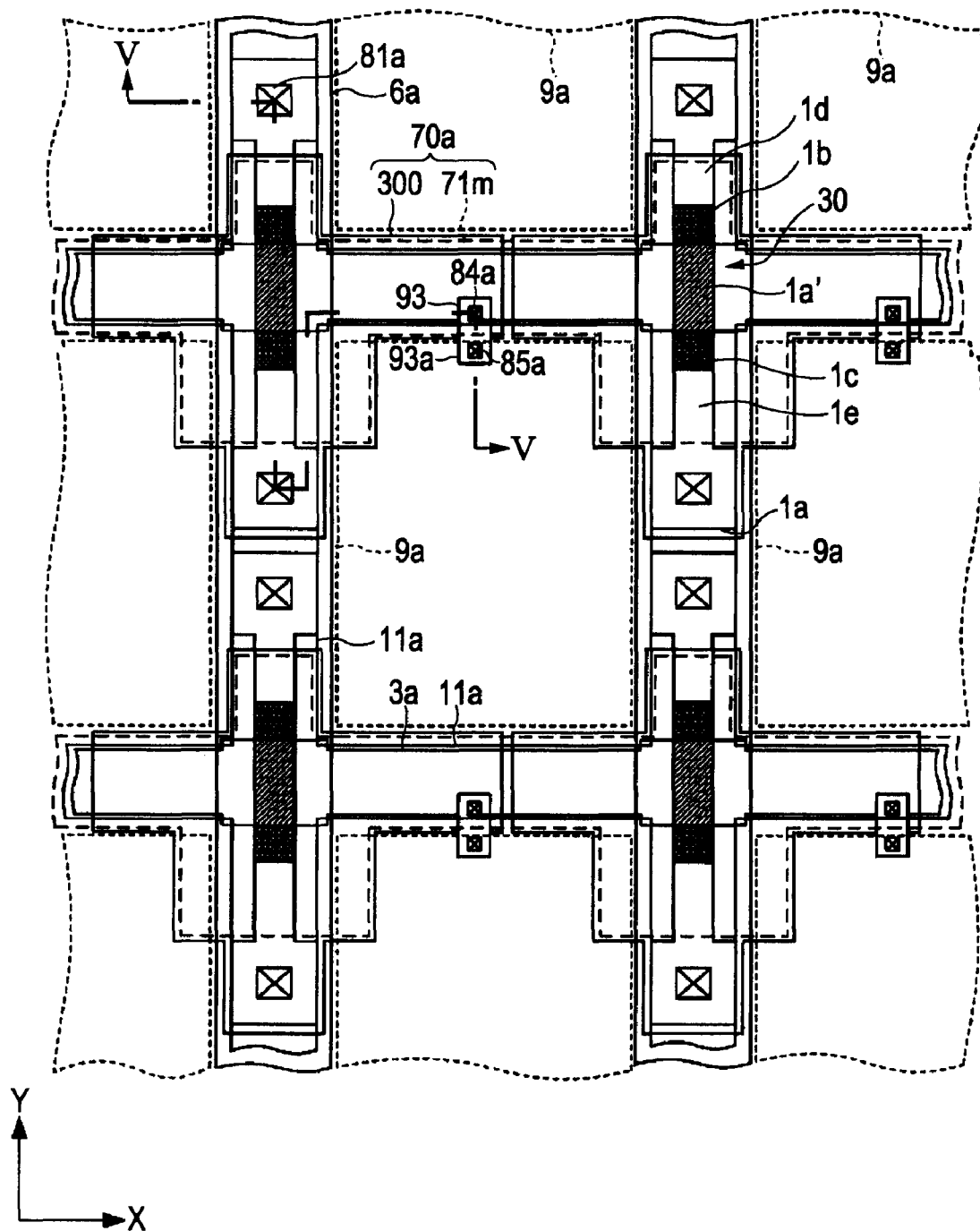
FIG. 4 is a plan view of the plurality of pixel portions of the liquid crystal device according to the first embodiment of the invention.
Figure 5:
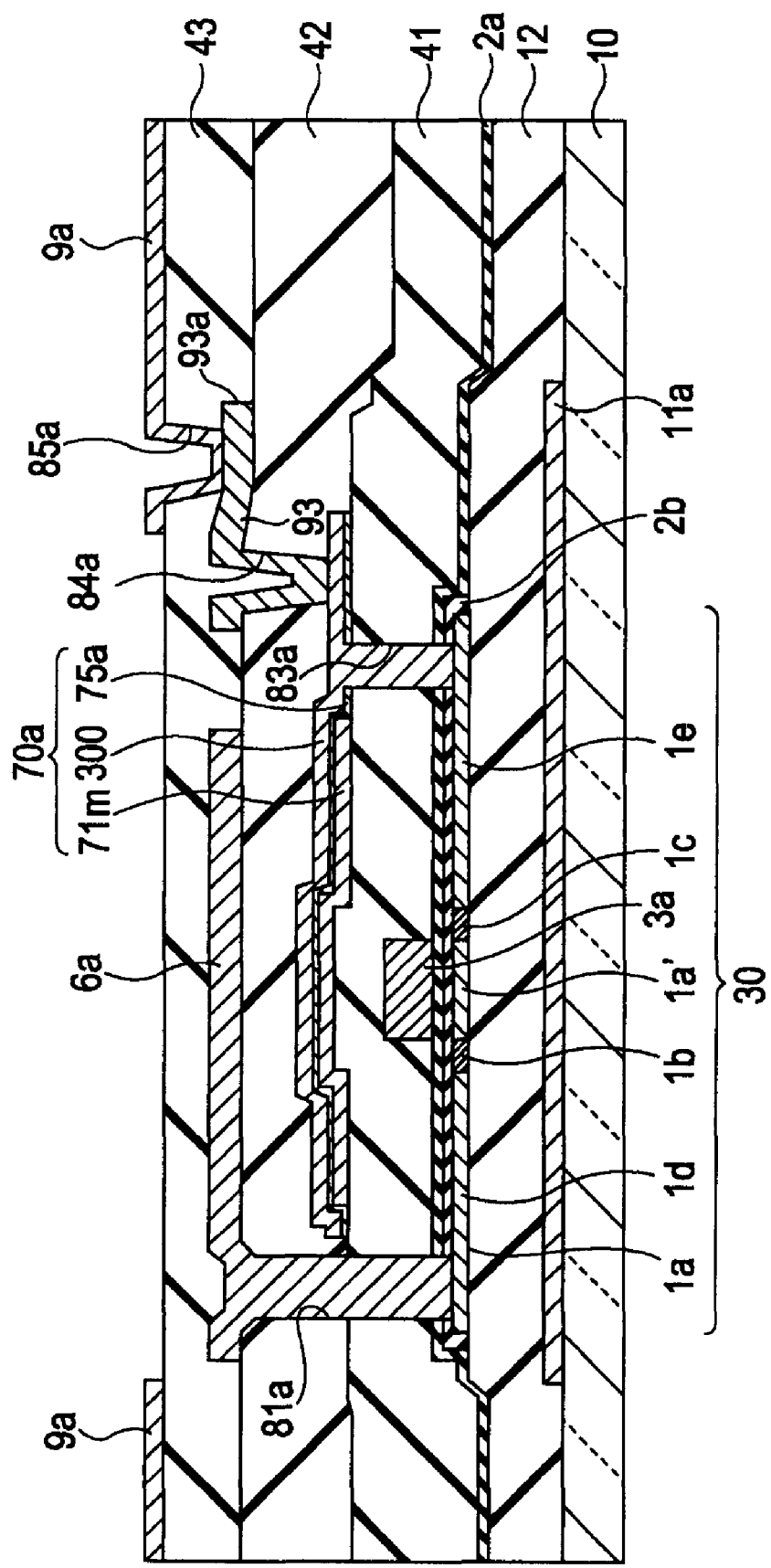
FIG. 5 is a cross-sectional view taken along line IV-IV of FIG. 4.

Next, the entire configuration of the pixel portion for realizing the above-described operation will be described with reference to FIGS. 4 and 5. FIG. 4 is a plan view of the plurality of adjacent pixel portions. FIG. 5 is a cross-sectional view taken along line IV-IV of FIG. 4. In FIGS. 4 and 5, the scale of each layer or each element is differentiated from each other in order that each layer or each element has a size capable of being identified in the view. In FIGS. 4 and 5, for convenience of description, a portion positioned at the upper side of the pixel electrodes 9a is not shown. In FIG. 5, a portion from the TFT array substrate 10 to the pixel electrodes 9a configures an example of the "substrate for the electro-optical device.".

In FIG. 4, the image display region 10a on the TFT array substrate 10 includes the plurality of pixel portions in which the pixel electrodes 9a are respectively provided.

The pixel electrodes 9a are provided on the TFT array substrate 10 in plural in a matrix. The data lines 6a and the scanning lines 3a are provided along the horizontal and vertical boundaries of the pixel electrodes 9a. The scanning lines 3a extend in an X direction and the data lines 6a extend in a Y direction to cross the scanning lines 3a. The pixel switching TFTs 30 are provided on the intersections between the scanning lines 3a and the data lines 6a.

The scanning lines 3a, the data lines 6a, the storage capacitors 70a, the lower light-shielding film 11a, a middle layer 93, and the TFTs 30 are arranged in non-opening regions surrounding the opening regions (that is, regions for transmitting or reflecting light actually contributing to the display in the pixels) of the pixels corresponding to the pixel electrodes 9a on the TFT array substrate 10 when viewed in plane. That is, the scanning lines 3a, the storage capacitors 70a, the data lines 6a, the lower light-shielding film 11a, and the TFTs 30 are arranged in the non-opening regions, not in the opening regions of the pixels, such that the display is not interrupted.

In FIGS. 4 and 5, the TFT 30 includes a semiconductor layer 1a and a portion of the scanning line 3a which is the gate line.

The semiconductor layer 1a is formed of, for example, polysilicon and includes a channel region 1a having a channel length along the Y direction, a data line side LDD region 1b and pixel electrode side LDD region 1c, and a data line side source/drain region 1d and pixel electrode side source/drain region 1e. That is, the TFT 30 has an LDD structure. In addition, the data line side LDD region 1b is an example of a first junction region and the pixel electrode side LDD region 1c is an example of a second junction region.

The data line side source/drain region 1d and the pixel electrode side source/drain region 1e are substantially mirror-symmetrical to each other in the Y-direction on the basis of the channel region 1a'. The data line side LDD region 1b is formed between the channel region 1a' and the data line side source/drain region 1d. The pixel electrode side LDD region 1c is formed between the channel region 1a' and the pixel electrode side source/drain region 1e. The data line side LDD region 1b, the pixel electrode LDD region 1c, the data line side source/drain region 1d, and the pixel electrode side source/drain region 1e are impurity regions obtained by doping impurities into the semiconductor layer 1a by an impurity implantation such as an ion implantation. The data line side LDD region 1b and the pixel electrode side LDD region 1c are formed as impurity regions having lower impurity concentrations than those of the data line side source/drain region 1d and the pixel electrode side source/drain region 1e, respectively. According to such impurity regions, it is possible to reduce off current flowing in the source and drain region at the time of the non-operation of the TFTs 30 and to suppress the reduction of on current at the time of the operation of the TFTs 30. The TFTs 30 preferably have the LDD structure, but may have an offset structure in which impurities are not doped into the data line side LDD region 1b and the pixel electrode side LDD region 1c or a self-alignment structure in which impurities are heavily doped using the gate electrode as a mask to form the data line side source/drain region and the pixel electrode side source/drain region.

As shown in FIGS. 4 and 5, the gate electrode of the TFT 30 is formed as a portion of the scanning line 3a and is made of, for example, conductive polysilicon. The scanning line 3a has a main line portion which extends along the X direction and portions which extend from the main line portion along the Y direction so as to overlap the region in which the main line portion does not overlap in the channel region 1a' of the TFT 30. A portion of the scanning line 3a which overlaps the channel region 1a' functions as the gate electrode. The gate electrode and the semiconductor layer 1a are insulated by a gate insulating film 2 (more particularly, two insulating films 2a and 2b).

The lower light-shielding film 11a which is provided below the TFT 30 in a matrix with an underlying insulating film 12 interposed therebetween shields the channel region 1a' of the TFT 30 and the periphery thereof from returning light input from the TFT array substrate 10 to the device. The lower light-shielding film 11a is made of, for example, metal containing at least one of high melting point metal such as Ti, Cr, W, Ta, Mo, and Pd, an alloy thereof, metal silicide, polysilicide, or a lamination thereof.

The underlying insulating film 12 is formed on the entire surface of the TFT array substrate 10 to have a function for preventing the characteristics of the pixel switching TFTs 30 from deteriorating due to contamination after cleaning or roughness at the time of polishing the surface of the TFT array substrate 10, in addition to a function for insulating the TFTs 30 from the lower light-shielding film 11a.

In FIG. 5, the storage capacitor 70a is provided above the TFTs 30 on the TFT array substrate 10 with an interlayer insulating film 41 interposed therebetween. The storage capacitor 70a is formed by arranging a lower capacitive electrode 71m and an upper capacitive electrode 300 to face each other with a dielectric film 75a interposed therebetween.

The upper capacitive electrode 300 is a pixel voltage side capacitive electrode electrically connected to the pixel electrode 9a and the pixel electrode side source/drain region 1e of the TFT 30. More particularly, the upper capacitive electrode 300 is electrically connected to the middle layer 93 via a contact hole 84a and electrically connects the pixel electrode side source/drain region 1e and the pixel electrode 9a. In addition, the middle layer 93 is connected to the pixel electrode 9a via a convex portion 93a which is a portion of the middle layer 93 and the contact hole 85a electrically connected to the convex portion 93a. Accordingly, the pixel electrode 9a and the upper capacitive electrode 300 are electrically connected.

The upper capacitive electrode 300 is a non-parent metal film provided above the TFT 30 and contains, for example, metal or an alloy thereof. The upper capacitive electrode 300 also functions as the upper light-shielding film (or a built-in light-shielding film) for shielding the TFT 30 from light. The upper capacitive electrode 300 is made of metal such as aluminum (Al) or silver (Ag).

The upper capacitive electrode 300 is an example of the "conductive light-shielding film" and may be made of metal containing at least one of high melting point metal such as titanium (Ti), chrome (Cr), tungsten (W), tantalum (Ta), molybdenum (Mo), and Palladium (Pd), an alloy thereof, metal silicide, polysilicide, or a lamination thereof. In this case, the function of the upper light-shielding film of the upper capacitive electrode 300 can be further improved.

The lower capacitive electrode 71m extends around the image display region 10a in which the pixel electrode 9a is arranged. The lower capacitive electrode 71m is a fixed-voltage capacitive electrode which is electrically connected to a constant voltage source and is held at a fixed voltage.

The lower capacitive electrode 71m is a non-transparent metal film, similar to the upper capacitive electrode 300. Accordingly, the storage capacitor 70a has a so-called MIM structure having a three-layer structure having a metal film, a dielectric film (insulating film), and a metal film. Here, the lower capacitive electrode 71m extends over the plurality of pixels and is shared by the plurality of pixels.

In the present embodiment, in particular, since the lower capacitive electrode 71m is made of a metal film, it is possible to reduce power consumption of the liquid crystal device at the time of driving the liquid crystal device and accomplish a high-speed operation of the element in each pixel portion, compared with a case where the lower capacitive electrode 71m is made of semiconductor. Accordingly, the liquid crystal device according to the present embodiment can realize a high-quality image display.

The dielectric film 75a has a single-layer structure or a multi-layer structure having a silicon oxide film such as a high-temperature oxide (HTO) film, a low-temperature oxide (LTO) film or a silicon nitride film.

In FIG. 5, the data line 6a and the middle layer 93 are provided above the storage capacitor 70a on the TFT array substrate 10 with the interlayer insulating film 42 interposed therebetween.

The data line 6a is electrically connected to the data line side source/drain region 1d of the semiconductor layer 1a via the interlayer insulting films 41 and 42 and the contact hole 81a penetrating through the gate insulating film 2. The data line 6a and the inside of the contact hole 81a are made of a material containing aluminum (Al), such as Al—Si—Cu or Al—Cu, Al, or a multi-layer film of an Al layer and a TiN layer. The data line 6a also has a function for shielding the TFT 30 from light.

The middle layer 93 is formed on the same plane as the data line 6a on the interlayer insulating film 42. The data line 6a and the middle layer 93 are formed by forming a thin film composed of a conductive material such as a metal film on the interlayer insulating film 42 using a thin-film forming method and partially removing, that is, patterning, the thin film to divide the data line 6a and the middle layer 93. Accordingly, since the data line 6a and the middle layer 93 can be formed by the same process, it is possible to simplify the process of manufacturing the device.

In FIG. 5, the pixel electrode 9a is formed above the data line 6a with the interlayer insulating film 43 interposed therebetween. The pixel electrode 9a is electrically connected to the pixel electrode side source/drain region 1e of the semiconductor layer 1a via the upper capacitive electrode 300, the contact holes 83a, 84a, and 85a, and the middle layer 93. The contact hole 85a is formed by forming a conductive material configuring the pixel electrode 9a, such as ITO, in the inner wall of an opening formed in the interlayer insulating layer 43. The alignment film which is subjected to a predetermined alignment process such as a rubbing process is provided on the upper surface of the pixel electrode 9a.

The configuration of the pixel portion described above is common in the pixel portions, as shown in FIG. 4. In the image display region 10 (see FIG. 1), the pixel portions are periodically formed. Meanwhile, in the liquid crystal device according to the present embodiment, the driving circuits such as the scanning line driving circuits 104 and the data line driving circuits 101 are formed in the peripheral region of the image display region 10a as described with respect to FIGS. 1 and 2.

Figure 6:
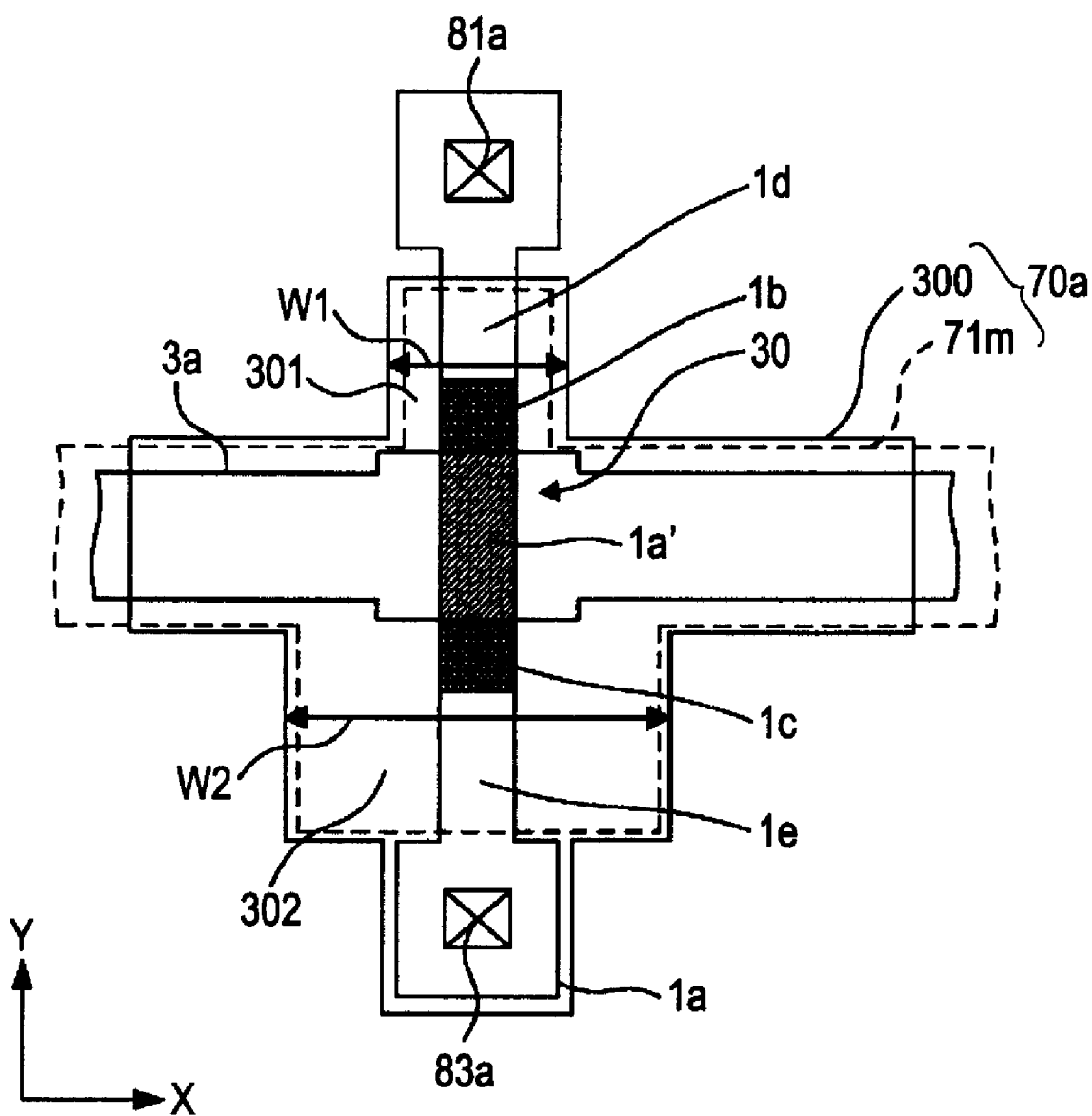
FIG. 6 is a plan view showing the planar shape of a storage capacitor of the liquid crystal device according to the first embodiment of the invention.

Next, the planar shape of a pair of capacitive electrodes configuring the storage capacitor as the light-shielding section of the liquid crystal device according to the present embodiment will be described in detail with reference to FIG. 6. Here, FIG. 6 is a plan view showing the planar shape of the pair of capacitive electrodes of the storage capacitor of the liquid crystal device according to the present embodiment. In FIG. 6, among the components configuring the pixel portion shown in FIG. 4, the TFT 30, the scanning line 3a, and the storage capacitor 70a are enlarged and shown.

As shown in FIG. 6, the upper capacitive electrode 300 configuring the storage capacitor 70a has a first portion 301 for covering the data line side LDD region 1b and a second portion 302 for covering the pixel electrode side LDD region 1c. Accordingly, light input from the upper layer side to the data line side LDD region 1b and the pixel electrode side LDD region 1c can be shielded by the first portion 301 and the second portion 302. Thus, it is possible to reduce the occurrence of light leak current in the data line side LDD region 1b and the pixel electrode side LDD region 1c.

In the present embodiment, in particular, the second portion 302 of the upper capacitive electrode 300 has an X direction width larger than that of the first portion 301. That is, the X direction width W2 of the second portion 302 is larger than the X direction width W1 of the first portion. Accordingly, it is possible to more reliably shield the light input to the pixel electrode side LDD region 1c, compared with the light input to the data line side LDD region 1b. That is, the shielding of the light which reaches the pixel electrode side LDD region 1c may be higher or more enhanced than that of the light which reaches the data line side LDD region 1b. Here, as described below, the present inventor observes that, at the time of operating the TFT, the light leak current in the pixel electrode side LDD region 1c is easy to occur compared with the data line side LDD region 1b. That is, it is observed that, in a case of irradiating light to the pixel electrode side LDD region 1c at the time of the operation of the TFT 30, light leak current is easy to occur compared with a case of irradiating light to the data line side LDD region 1b. Accordingly, by forming the second portion 302 to have the width W2 larger than the width W1 of the first portion 301, it is possible to increase the light-shielding effect for the pixel electrode side LDD region 1c in which light leak current is easy to occur and to efficiently reduce light leak current. In contrast, by forming the first portion 301 for covering the data line side LDD region 1b in which light leak current is hard to occur to have the width W1 smaller than that of the second portion 302, it is possible to prevent a numerical aperture from being vainly reduced.

That is, it is possible to improve the light-shielding effect for the pixel electrode side LDD region 1c in which light leak current is easy to relatively occur by increasing the width W2 of the second portion 302 and to prevent the numerical aperture from being vainly reduced by decreasing the width W1 of the first portion 301. That is, it is possible to efficiently reduce light leak current of the transistor without causing the vain reduction of the numerical aperture by improving the light-shielding effect for the pixel electrode side LDD region 1c in which light leak current is easy to occur, that is, increasing a pinpoint.

Now, the reason why, at the time of the operation of the TFT 30, in the pixel electrode side LDD region 1c, the light leak current is easy to occur, compared with the data line side LDD region 1b, will be described in detail with reference to FIGS. 7 to 12.

Figure 7:
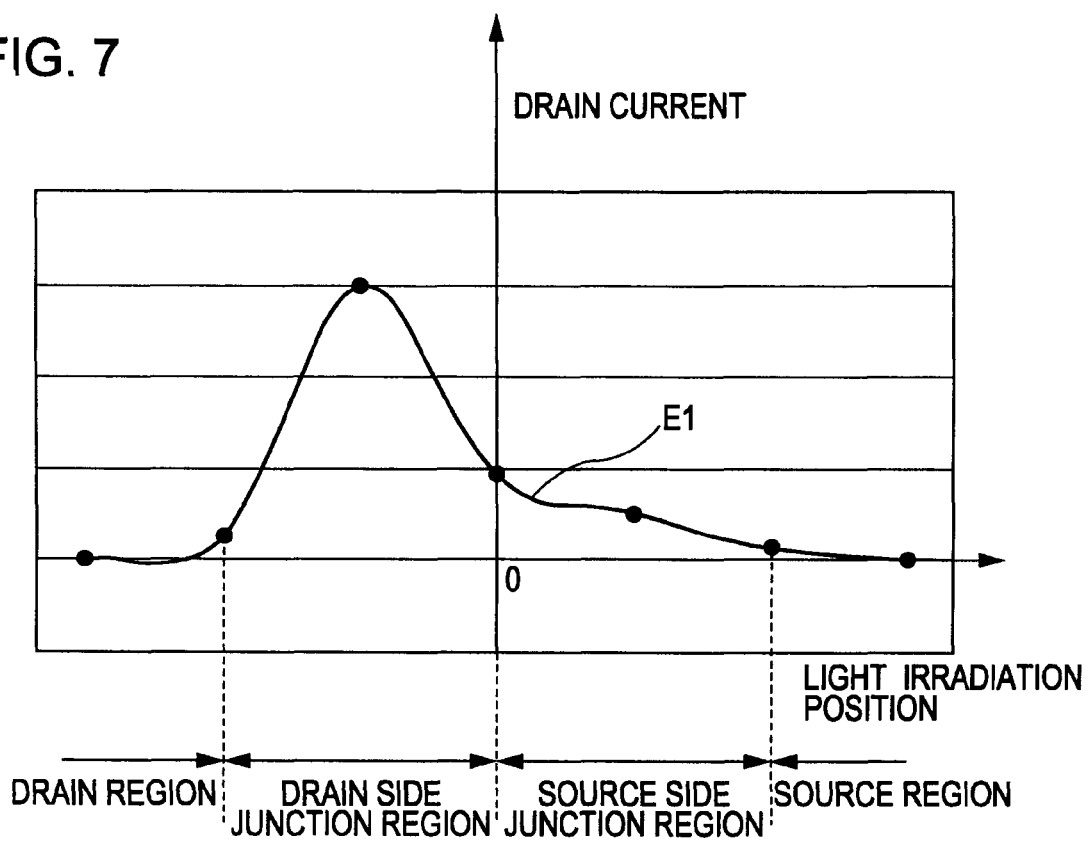
FIG. 7 is a graph showing a relationship between a light irradiation position and drain current in a TEG.

First, the result of measuring the level of drain current when light is irradiated to a test TFT will be described. FIG. 7 is a graph showing a relationship between a light irradiation position and drain current in a test TFT.

In FIG. 7, data E1 shows the result of measuring the level of drain current when light spots (visible light laser of about 2.4 μm) are irradiated to the test TFT, that is, a test element group (TEG) while sequentially scanning the drain region side to the source region side. The TEG has a source side junction region formed in a junction between the channel region and the source region and a drain side junction region formed in a junction between the channel region and the drain region, in addition to the channel region, the source region, and the drain region.

The horizontal axis of FIG. 7 indicates the light irradiation position where the light spots are irradiated. Here, a boundary between the channel region and the drain side junction region, a boundary between the channel region and the source side junction region, and the channel region have a zero value. The vertical axis of FIG. 7 indicates the level of the drain current (a relative value standardized to a predetermined value), which has a positive value (that is, a plus value) when the drain current flows from the drain region to the source region and a negative value (that is, a minus value) when the drain current flows from the source region to the drain region.

In FIG. 7, the data E1 shows the plus vale even at any light irradiation position. That is, it is indicated that the drain current flows from the drain region to the source region. In addition, the data E1 indicates that the value of the drain side junction region is larger than that of the source side junction region. That is, it is indicated that, in the case where the light spots are irradiated to the drain side junction region, the drain current further increases compared with the case where the light spots are irradiated to the source side junction region. That is, it is indicated that, in the case where the light spots are irradiated to the drain side junction region, the light leak current further increases compared with the case where the light spots are irradiated to the source side junction region. In addition, the drain current includes dark current (or subthreshold leak, that is, leak current which flows between the source region and the drain region in the off state of the TEG even in the state that light is not irradiated) and light leak current (or light excitation current, that is, current which occurs due to the excitation of electrons due to the irradiation of light).

Figure 8:
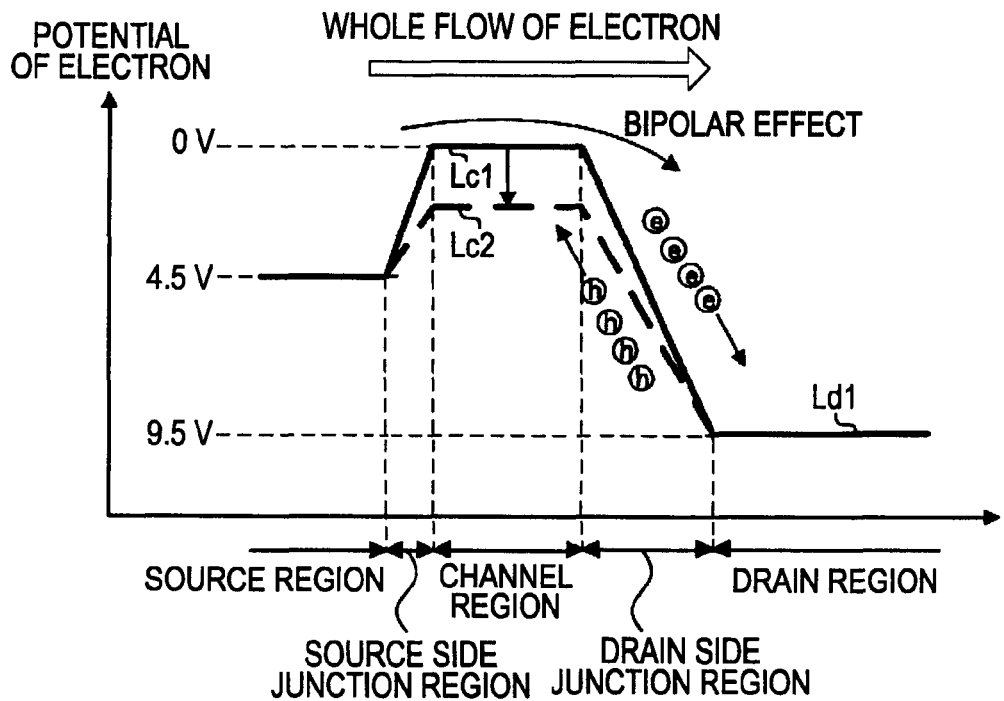
FIG. 8 is a conceptual diagram showing the action of carriers when light excitation occurs in a drain side junction region.
Figure 9:
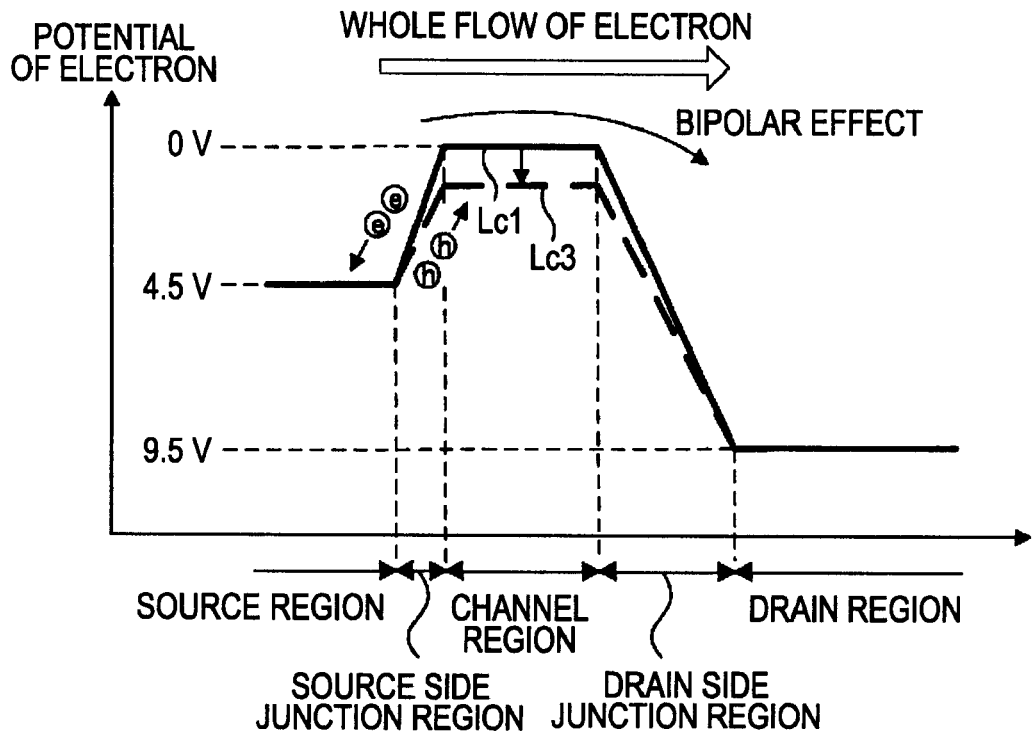
FIG. 9 is a conceptual diagram showing the action of carriers when light excitation occurs in a source side junction region.

Next, the mechanism that, in the case where the light spots are irradiated to the drain side junction region, the light leak current further increases, compared with the case where the light spots are irradiated to the source side junction region will be described with reference to FIGS. 8 and 9. FIG. 8 is a conceptual diagram showing the action of carriers when light excitation occurs in the drain side junction region. FIG. 9 is a conceptual diagram showing the action of carriers when light excitation occurs in a source side junction region. In FIGS. 8 and 9, in consideration of the display of the intermediate gray scales in the pixel electrode 9a electrically connected with the TFT 30, a source voltage (that is, the voltage of the source region) is 4.5 V, a gate voltage (that is, the voltage of the channel region) is 0 V, and a drain voltage (that is, the voltage of the drain region) is 9.5 V The horizontal axes of FIGS. 8 and 9 indicate the respective regions of the semiconductor layer configuring the TEG The vertical axes of FIGS. 8 and 9 indicate the potential (Fermi level) of an electron. Since the electron has a negative charge, the potential of the electron decreases as the voltage of each region increases and the potential of the electron increases as the voltage of each region decreases.

FIG. 8 shows the action of the carriers when light excitation occurs in the drain side junction region by irradiating light spots to the drain side junction region formed between the channel region and the drain region.

In FIG. 8, it may be estimated that the light leak current includes two current components.

That is, as a first current component, there is a current component due to the movement of electrons which occur by light excitation. In more detail, this current component is a current component (this current component flows from the drain region to the source region) which occurs by moving the electrons (see "e" in the drawing), which occur in the drain side junction region by light excitation, from the drain side junction region to the drain region having a lower potential.

As a second current component, there is a current component which occurs by moving holes (see "h" in the drawing) which occur by light excitation. In more detail, this current component is a current component (this current component flows from the drain region to the source region) due to a bipolar effect which occurs by moving the holes, which occur in the drain side junction region by light excitation, from the drain side junction region to the channel region having a lower potential (a higher potential in view of the potential of the electron). That is, this current component is a current component due to the effect that the number of electrons which flow from the source region to the drain region increases, because the potential of the channel region (that is, the so-called base potential) decreases from a potential Lc1 to a potential Lc2 by the positive charges, that is, the holes, moved to the channel region. Accordingly, when light excitation occurs in the drain side junction region, both the first and second current components occur in a direction (from the drain region to the source region) for increasing the drain current (in other words, collector current).

FIG. 9 is a conceptual diagram showing the action of carriers when light excitation occurs in the source side junction region.

In FIG. 9, it is estimated that, in the light leak current, the second current component due to the bipolar effect that the holes moves from the source side junction region to the channel region having a lower potential (that is, a higher potential in view of the potential of the electron) is dominant, unlike the case where light excitation occurs in the drain side junction region in FIG. 8. That is, it is estimated that the first current component (this current component flows from the source region to the drain region) which occurs by moving the electrons (see "e" in the drawing) which occur in the source side junction region by light excitation from the source side junction region to the source region having a lower potential is lower than the second current component (this current component flows from the drain region to the source region) due to the bipolar effect.

In FIG. 9, since the second current component (that is, the current component due to the effect that the number of electrons which flow the source region to the drain region increases, because the base potential decreases from the potential Lc1 to the potential Lc3 by the positive charges, that is, the holes, moved to the channel region) due to the bipolar effect flows from the drain region to the source region. In addition, the first current component flows from the source region to the drain region. That is, the first current component and the second current component flow in the opposite directions. In FIG. 7, when light spots are irradiated to the source side junction region, the drain current (see data E1) has the positive value. That is, in this case, the drain current flows from the drain region to the source region. Accordingly, the first current component only suppresses the dark current or the second current component, that is, the current component due to the bipolar effect, and is not large enough to allow the drain current to flow from the source region to the drain region.

Since the voltage difference between the channel region and the source region is smaller than that between the channel region and the drain region, the depletion region (that is, the source side junction region) of the source region is narrower than the depletion region (that is the drain side junction region) of the drain region, Accordingly, in the case where light spots are irradiated to the source side junction region, the absolute amount of light excitation is reduced, compared with the case where light spots are irradiated to the drain side junction region.

As described above, as described with reference to FIGS. 8 and 9, when light excitation occurs in the drain side junction region, the first and second current component occur such that the drain current increases. When light excitation occurs in the source side junction region, the first current component suppresses the second current component. Accordingly, in the case where light spots are irradiated to the drain side junction region, the drain current further increases (that is, the light leak current increases) compared with the case where light spots are irradiated to the source side junction region.

Figure 10:
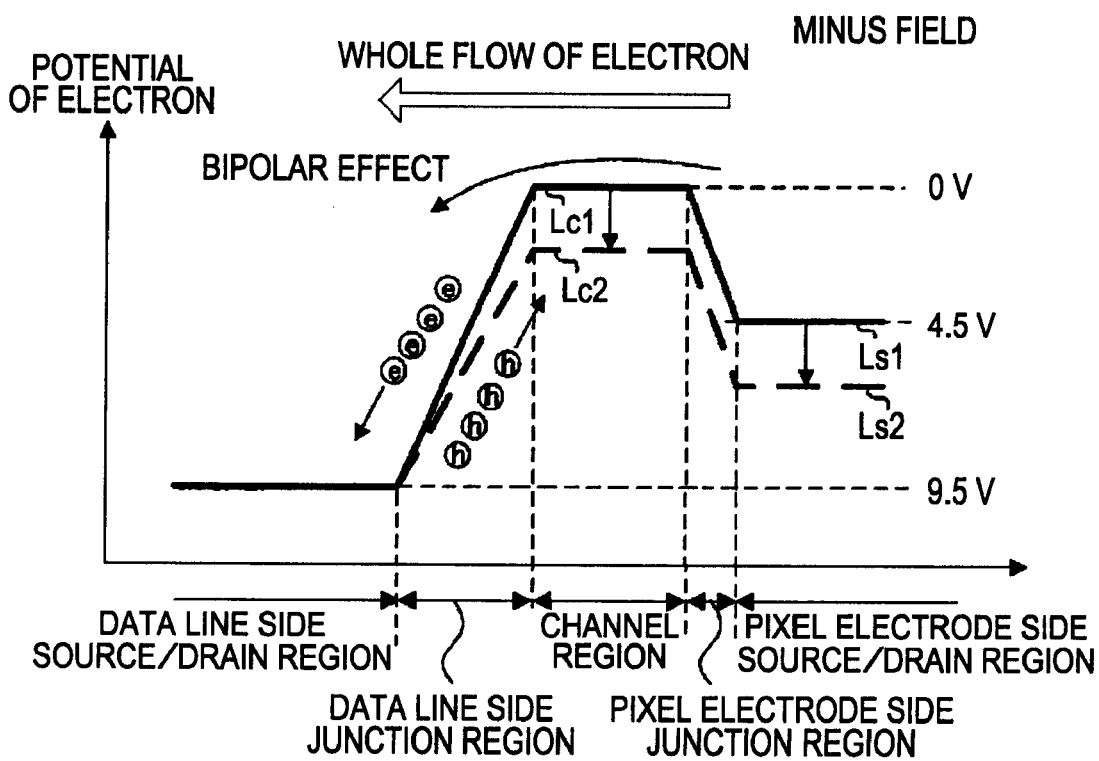
FIG. 10 is a conceptual diagram showing the action of carriers when light excitation occurs in a data line side junction region in a case where a data line side source/drain region has a drain voltage.
Figure 11:
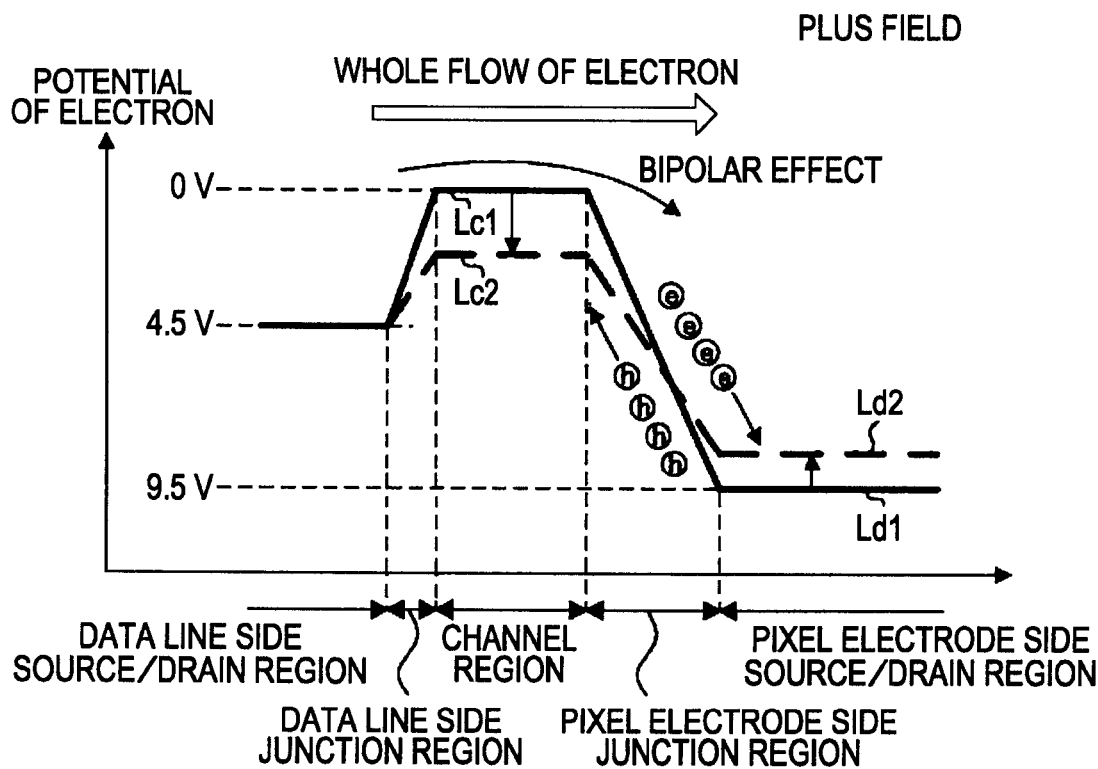
FIG. 11 is a conceptual diagram showing the action of carriers when light excitation occurs in a pixel electrode side junction region in a case where a pixel electrode side source/drain region has a drain voltage.

Next, the mechanism that, in the case where the pixel electrode side source/drain region has the drain voltage and the light spots are irradiated to the pixel electrode side junction region, the light leak current further increases, compared with the case where the data line side source/drain region has the drain voltage and the light spots are irradiated to the data line side junction region will be described with reference to FIGS. 10 and 11. FIG. 10 is a conceptual diagram showing the action of carriers when light excitation occurs in the data line side junction region (in other words, the drain side junction region) in a case where the data line side source/drain region has the drain voltage. FIG. 11 is a conceptual diagram showing the action of carriers when light excitation occurs in the pixel electrode side junction region (in other words, the drain side junction region) in a case where the pixel electrode side source/drain region has the drain voltage.

Hereinafter, a case where charges are held in the pixel portion including the pixel switching TFT and light excitation occurs is considered. This case is different from the case of using the TEG in that the pixel electrode of the pixel switching TFT may be in a floating state. Since the retention capacitor such as the storage capacitor 70a may be connected to the pixel electrode of the pixel switching TFT, the pixel electrode of the pixel switching TFT is in a state close to a fixed electrode, similar to the case of using the TEG, if the capacitive value is sufficiently large, and is in a floating state or in a state close to the floating state if the capacitive value is not sufficiently large. Here, it is assumed that the capacitive value is not sufficiently large.

In FIGS. 10 and 11, in the liquid crystal device, DC driving is employed in order to prevent so-called burn-in. Here, for the display of the intermediate gray scales, it is considered that charges of a minus field of 4.5 V and charges of a plus field of 9.5 V are alternately held in the pixel electrode using 7 V as a reference voltage. Accordingly, the source and the drain of the pixel switching TFT vary between the pixel electrode side source/drain region and the data line side source/drain region. That is, as shown in FIG. 10, when the charges of the minus field are held in the pixel electrode (that is, the voltage of the pixel electrode side source/drain region becomes lower than that of the data line side source/drain region), the pixel electrode side source/drain region becomes the source. In contrast, as shown in FIG. 11, when the charges of the plus field are held in the pixel electrode (that is, the voltage of the pixel electrode side source/drain region becomes higher than that of the data line side source/drain region), the pixel electrode side source/drain region becomes the drain.

In FIG. 10, when the charges of the minus field are held in the pixel electrode, the pixel electrode side source/drain region becomes the source (or an emitter) and the data line side source/drain region becomes the drain (or a collector). When light excitation occurs in the data line side junction region which is the drain side junction region, the first current component due to the movement of the electrons which occur by light excitation and the second current component due to the bipolar effect occur, as described above. Here, when the second current component due to the bipolar effect occurs (that is, when the base potential decreases from the potential Lc1 to the potential Lc2 and the electrons move from the pixel electrode side source/drain region of the source to the data line side source/drain region of the drain), the electrons are extracted from the pixel electrode side source/drain region which is in the floating state and thus the potential of the pixel electrode side source/drain region as the emitter decreases from the potential Ls1 to the potential Ls2 (the voltage increases). That is, when light excitation occurs in the data line side junction region which is the drain side junction region, the base potential decreases and the potential of the pixel electrode side source/drain region as the emitter also decreases. In other words, when light excitation occurs in the data line side junction region which is the drain side junction region, the voltage of the emitter increases as the base potential increases. Accordingly, the drain current (that is, the emitter current and the collector current) are suppressed.

Meanwhile, in FIG. 11, when the charges of the plus field are held in the pixel electrode, the data electrode side source/drain region becomes the source (or the emitter) and the pixel electrode side source/drain region becomes the drain (or the collector). When light excitation occurs in the pixel electrode side junction region which is the drain side junction region, the first current component due to the movement of the electrons which occur by light excitation and the second current component due to the bipolar effect occur, as described above. Here, since the data line side source/drain region of the source is connected to the data line, the data line side source/drain region is not in the floating state, unlike the pixel electrode, and the voltage is not changed. When the second current component due to the bipolar effect occurs (that is, when the base potential decreases from the potential Lc1 to the potential Lc2 and the electrons move from the data line side source/drain region of the source to the pixel electrode source/drain region of the drain), the electrons flow into the pixel electrode side source/drain region which is in the floating state and thus the potential of the pixel electrode side source/drain region as the collector increases from the potential Ld1 to the potential Ld2 (the voltage decreases). However, the increase of the potential of the pixel electrode side source/drain region as the collector hardly suppresses the drain current, unlike the decrease of the potential of the pixel electrode side source/drain region as the source. Since the drain current (that is, the collector current) is determined by the level of the base voltage for the emitter voltage, the drain current is hardly suppressed, that is, a bipolar transistor is in a saturation state, even when the collector voltage decreases.

As described with reference to FIGS. 10 and 11, when the charges of the plus field are held in the pixel electrode (that is, the pixel electrode side source/drain region becomes the drain), the second current component due to the bipolar effect is hardly suppressed. In contrast, when the charges of the minus field are held in the pixel electrode (that is, the data side source/drain region becomes the drain), the second current component due to the bipolar effect is suppressed due to the increase of the voltage of the pixel electrode side source/drain region which is in the floating state. That is, in the case where the pixel electrode side source/drain region becomes the drain, the drain current further increases due to the light leak current, compared with the case where the data side source/drain region becomes the drain.

Figure 12:
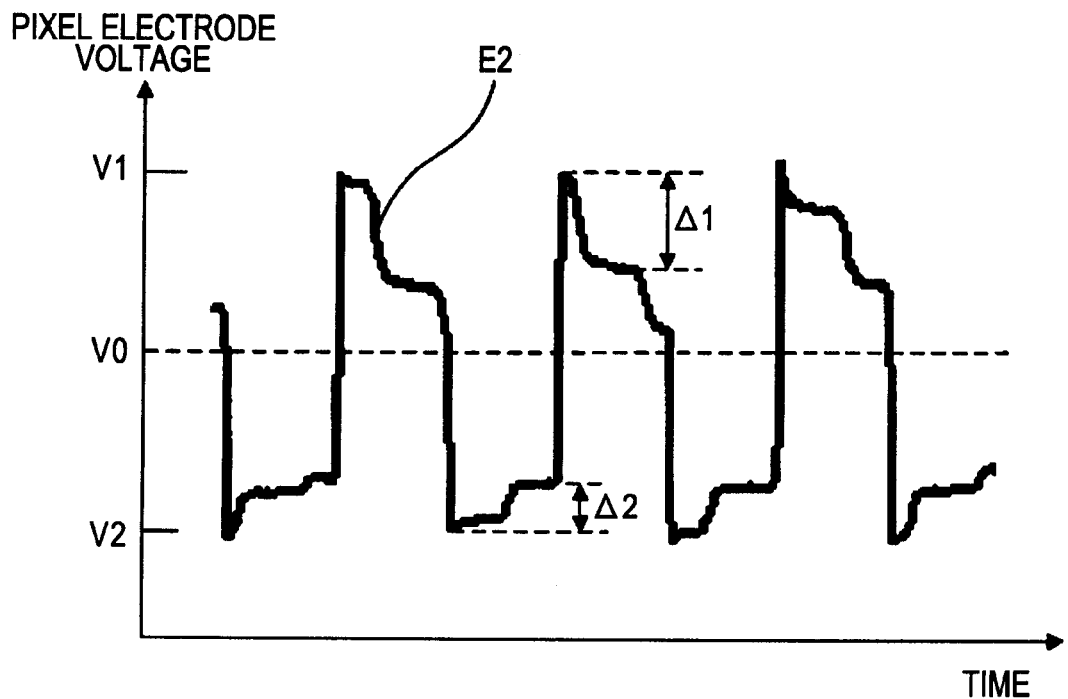
FIG. 12 is a waveform diagram showing the waveform of the voltage of the pixel electrode when light is irradiated to the entire pixel switching TFT.

FIG. 12 is a waveform diagram showing the waveform of the voltage of the pixel electrode when relative strong light is irradiated to the entire pixel switching TFT.

In FIG. 12, data E2 indicates that a variation Δ1 in voltage of the pixel electrode when the charges of the plus field are held in the pixel electrode (when the voltage of the pixel electrode becomes a voltage V1) is larger than a variation Δ2 in voltage of the pixel electrode when the charges of the minus field are held in the pixel electrode (when the voltage of the pixel electrode becomes a voltage V2). That is, in the pixel electrode, it is indicated that the charges of the plus field is hard to be held in the pixel electrode, that is, light leak is easy to occur, compared with the charges of the minus field. This is identical to the above-described mechanism that, in the case where the charges of the plus field are held in the pixel electrode (that is, the pixel electrode side source/drain region becomes the drain), the light leak current is easy to occur, compared with the case where the charges of the minus field are held in the pixel electrode (that is, the data line side source/drain region becomes the drain).

As described in detail with reference to FIGS. 7 to 12, the drain current is easy to increase when light excitation occurs in the drain side junction region in the pixel switching TFT. In addition, the drain current is easy to increase when the pixel electrode side source/drain region becomes the drain (in contrast, the current component due to the bipolar effect is suppressed when the data line side source/drain region becomes the drain). Accordingly, according to the liquid crystal device according to the present embodiment, it is possible to efficiently obtain a high light-shielding effect while maintaining a high numerical aperture, by allowing the light-shielding effect for the pixel electrode side LDD region which is the pixel electrode side junction region to become higher than that of the data line side LDD region which is the data line side junction region.

As described above, according to the liquid crystal device including the substrate for the electro-optical device, it is possible to reduce a display failure such as flicker due to the occurrence of the light leak current without vainly reducing a numerical aperture.

Second Embodiment

Figure 13:
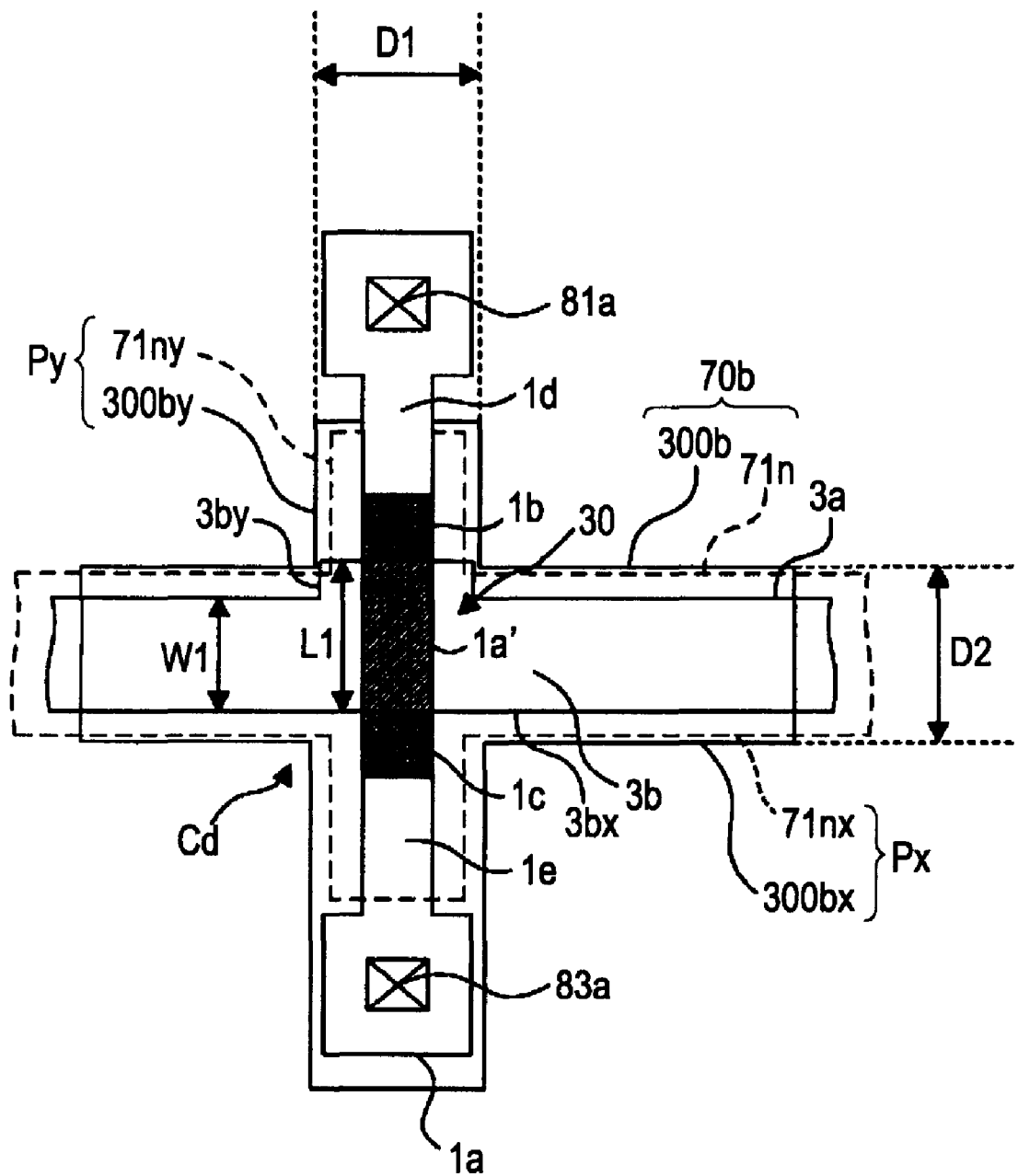
FIG. 13 is a plan view having the same purpose as FIG. 6 in a second embodiment of the invention.

Next, a liquid crystal device according to a second embodiment will be described with reference to FIG. 13. FIG. 13 is a plan view having the same purpose as FIG. 6 in the second embodiment. In FIG. 13, the same components as the components according to the first embodiment shown in FIG. 6 are denoted by the same reference numerals and thus the description thereof will be properly omitted.

In FIG. 13, the liquid crystal device according to the second embodiment includes a TFT 30, a scanning line 3a, and a storage capacitor 70b.

The TFT 30 includes a semiconductor layer 1a including a channel region 1a' and a gate electrode 3b including a portion of the scanning line 3a, which overlaps the channel region 1a'. The channel region 1a' has a channel length L1 along the Y direction in a first region D1 which extends along the Y direction in the display region of each of non-opening regions which discriminate between the opening regions of the plurality of pixels. The semiconductor layer 1a has a data line side LDD region 1b formed between the channel region 1a' and the data line side source/drain region 1d and a pixel electrode side LDD region 1c formed between the channel region 1a' and the pixel electrode side source/drain region 1c. That is, the semiconductor layer 1a has the data line side LDD region 1b formed at the side of the data line side source/drain region 1d and the pixel electrode side LDD region 1c formed at the side of the pixel electrode side source/drain region 1e on the basis of the channel region 1a'.

The scanning line 3a is formed along the X direction in a second region D2 which extends along the X direction in the non-opening region. A portion of the scanning line is formed as a gate electrode 3b. The gate electrode 3b overlaps the channel region 1a' in the intersection between the first region D1 and the second region D2.

The storage capacitor 70b includes an upper capacitive electrode 300b, a lower capacitive electrode 71n, and a dielectric film interposed between the capacitive electrodes. The planar shapes of the upper capacitive electrode 300b and the lower capacitive electrode 71n of the storage capacitor 70b are different from those of the upper capacitive electrode 300 and the lower capacitive electrode 71n of the storage capacitor 70a according to the first embodiment. In the other configuration, the storage capacitor 70b is similar to the storage capacitor 70a.

The storage capacitor 70b has a first portion Py which extends along the Y direction from a intersection region in which the first region D1 and the second region D2 intersect, a second portion Px which extends from the intersection region along the X direction, and an intersection portion Cd in which the first portion Py and the second portion Px intersect with each other in the intersection region.

The first portion Py includes a lower capacitive electrode Y-side extending portion 71ny of the lower capacitive electrode 71n, which extends along the Y direction, an upper capacitive electrode Y-side extending portion 300by of the upper capacitive electrode 300b, which extends along the Y direction, and a portion of the dielectric film, which extends between the lower capacitive electrode Y-side extending portion 71ny and the upper capacitive electrode Y-side extending portion 300by. The second portion Px includes a lower capacitive electrode X-side extending portion 71nx of the lower capacitive electrode 71n, which extends along the X direction, an upper capacitive electrode X-side extending portion 300bx of the upper capacitive electrode 300b, which extends along the X direction, and a portion of the dielectric film, which extends between the lower capacitive electrode X-side extending portion 71nx and the upper capacitive electrode X-side extending portion 300bx.

In the present embodiment, in particular, at least a portion of the pixel electrode side LDD region 1c overlaps the intersection portion Cd in the intersection region on the TFT array substrate 10 when viewed in plane. The data line side LDD region 1b does not overlap the intersection portion Cd. As described in detail with reference to FIGS. 7 to 12, the present inventor observes that, at the time of the operation of the TFT 30, in the pixel electrode side LDD region 1c, the light leak current is easy to occur, compared with the data line side LDD region 1b. In the intersection portion Cd and the second portion Px, in the case where at least a portion of the pixel electrode side LDD region 1c overlaps the intersection portion Cd, it is possible to reduce the light irradiated to the pixel electrode side LDD region 1c, compared with the case where the pixel electrode side LDD region 1c does not overlap the intersection portion Cd. In more detail, in the Y direction, incident light which is obliquely input to the pixel electrode side LDD region 1c at a large angle with respect to the direction normal to the surface along the surface of the first portion Py is shielded by the first portion Py, because the first portion Py extends along the Y direction. Accordingly, by overlapping the pixel electrode side LDD region 1c with the intersection portion Cd, it is possible to improve the light-shielding effect for the pixel electrode side LDD region 1c. Accordingly, Thus, in order to improve the light-shielding effect for the pixel electrode side LDD region 1c in which the light leak current is easy to occur, the width the first portion Py or the second portion Px of the storage capacitor 70b does not need to increase. That is, according to the liquid crystal device according to the present embodiment, the numerical aperture is hardly reduced while improving the light-shielding effect for the pixel electrode side LDD region 1c. In view of the improvement of the numerical aperture, the widths of the first portion Py and the second portion Px of the storage capacitor 70b are preferably small. That is, the intersection portion Cd is preferably small.

Compared with the pixel electrode side LDD region 1c, the data line side LDD region 1b in which the light leak current is hard to occur may not overlap the intersection portion Cd. Even in this case, the data line side LDD region 1b overlaps the first portion Py of the storage capacitor 70b so as to be shield from light and the light leak current is hard to occur in practice.

In addition, in the present embodiment, in particular, the gate electrode 3b has a main line portion which extends along the X direction in the second region D2 and a convex portion 3by which protrudes from the main line portion 3bx to the side of the data line side LDD region 1b along the Y direction in the first region D1. The channel length L1 of the channel region 1a' is set according to the element characteristics required for the TFT 30. Therefore, when the size of the channel region 1a' or the length of the semiconductor layer 1a along the channel length L1 is changed such that the pixel electrode side LDD region 1c overlaps the intersection portion Cd, the original element characteristics of the TFT 30 are changed. Accordingly, although the occurrence of the light leak current is reduced by overlapping the pixel electrode side LDD region 1c with the intersection portion Cd, the element characteristics such as the switching characteristics required for the TFT 30 is changed. Thus, the light leak current can be reduced, but the original element characteristics cannot be obtained. In particular, like the present embodiment, in the case where the channel length L1 is larger than or equal to the width W1 of the main line portion 3bx of the gate electrode 3b, if no action is taken, at least a portion of the pixel electrode side LDD region 1c overlaps the intersection portion Cd and thus the channel region 1a' protrudes from the main line portion 3bx along the Y direction.

However, in the present embodiment, in particular, as described above, the gate electrode 3b has the convex portion 3by which protrudes from the main line portion 3bx to the side of the data line side LDD region 1b along the Y direction. Accordingly, even when the channel region 1a' is shifted to the side of the data line side LDD region 1b along the Y direction, the gate electrode 3b can be positioned to overlap the channel region 1a'. In addition, since the convex portion 3by overlaps the first portion Py which extends along the Y direction, the non-opening region does not increase. Accordingly, it is possible to position the gate electrode 3b to overlap the channel region 1a' without reducing the numerical aperture.

Third Embodiment

Figure 14:
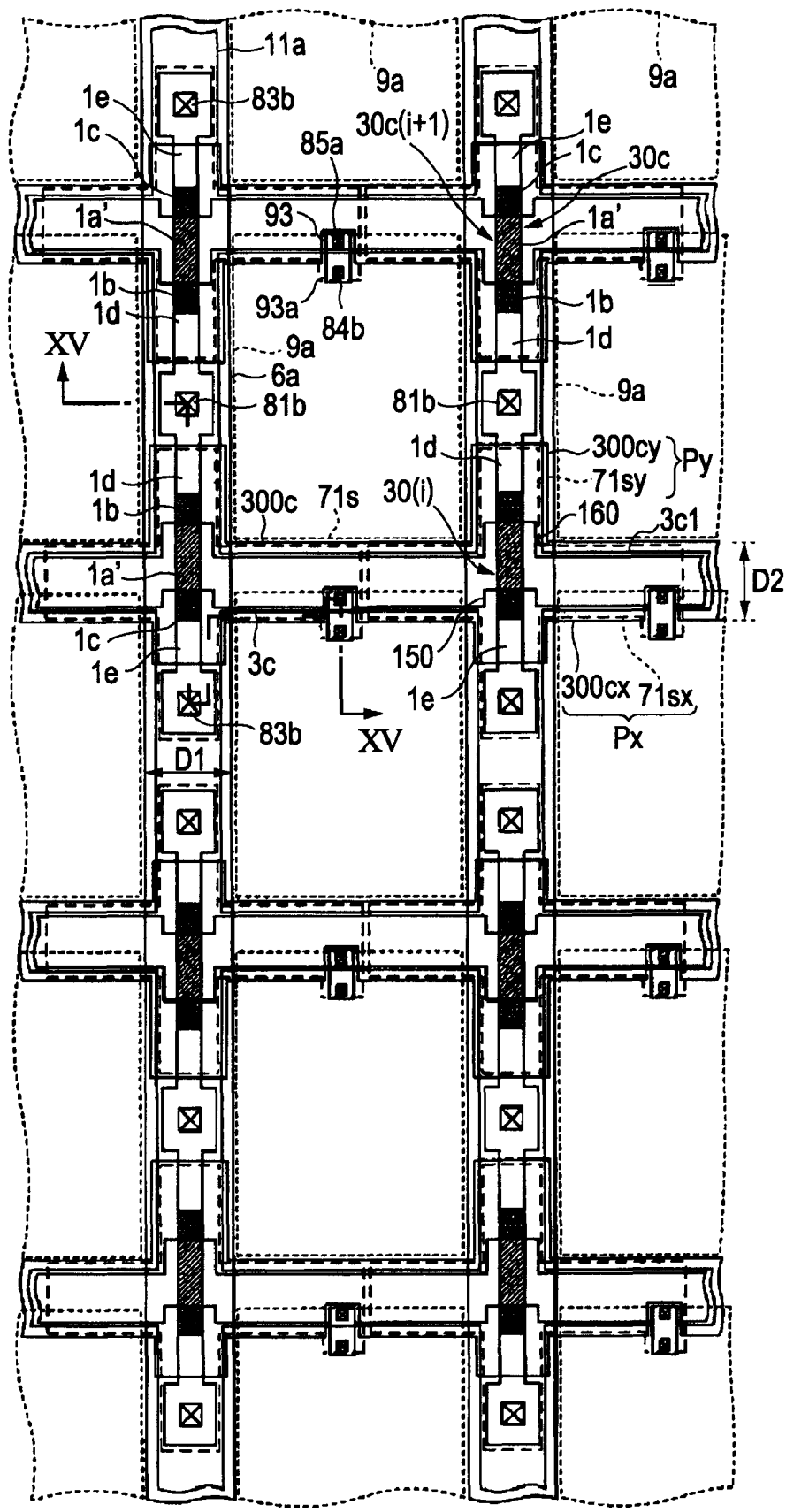
FIG. 14 is a plan view having the same purpose as FIG. 4 in a third embodiment of the invention.
Figure 15:
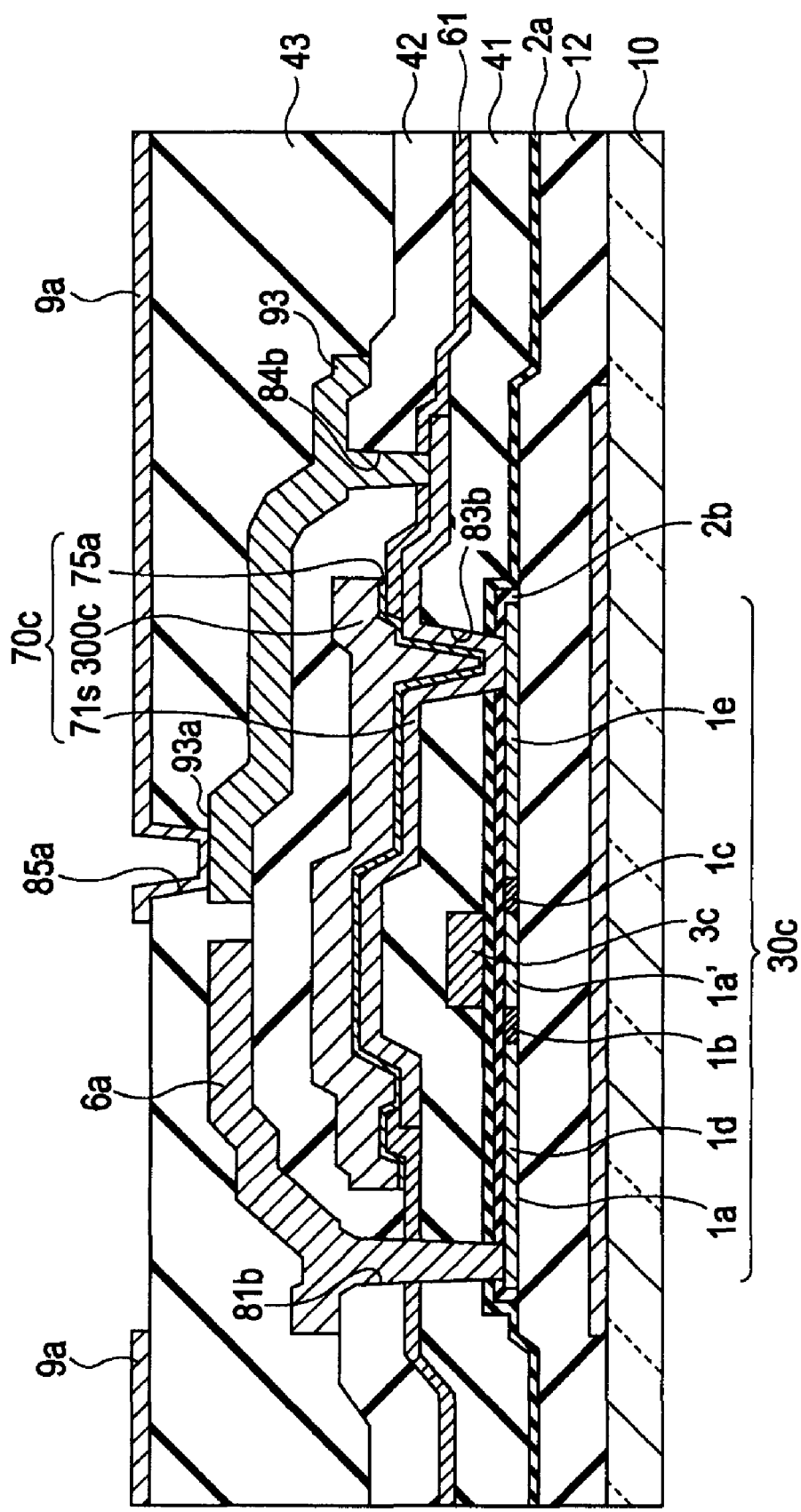
FIG. 15 is a cross-sectional view taken along line XV-XV.
Figure 16:
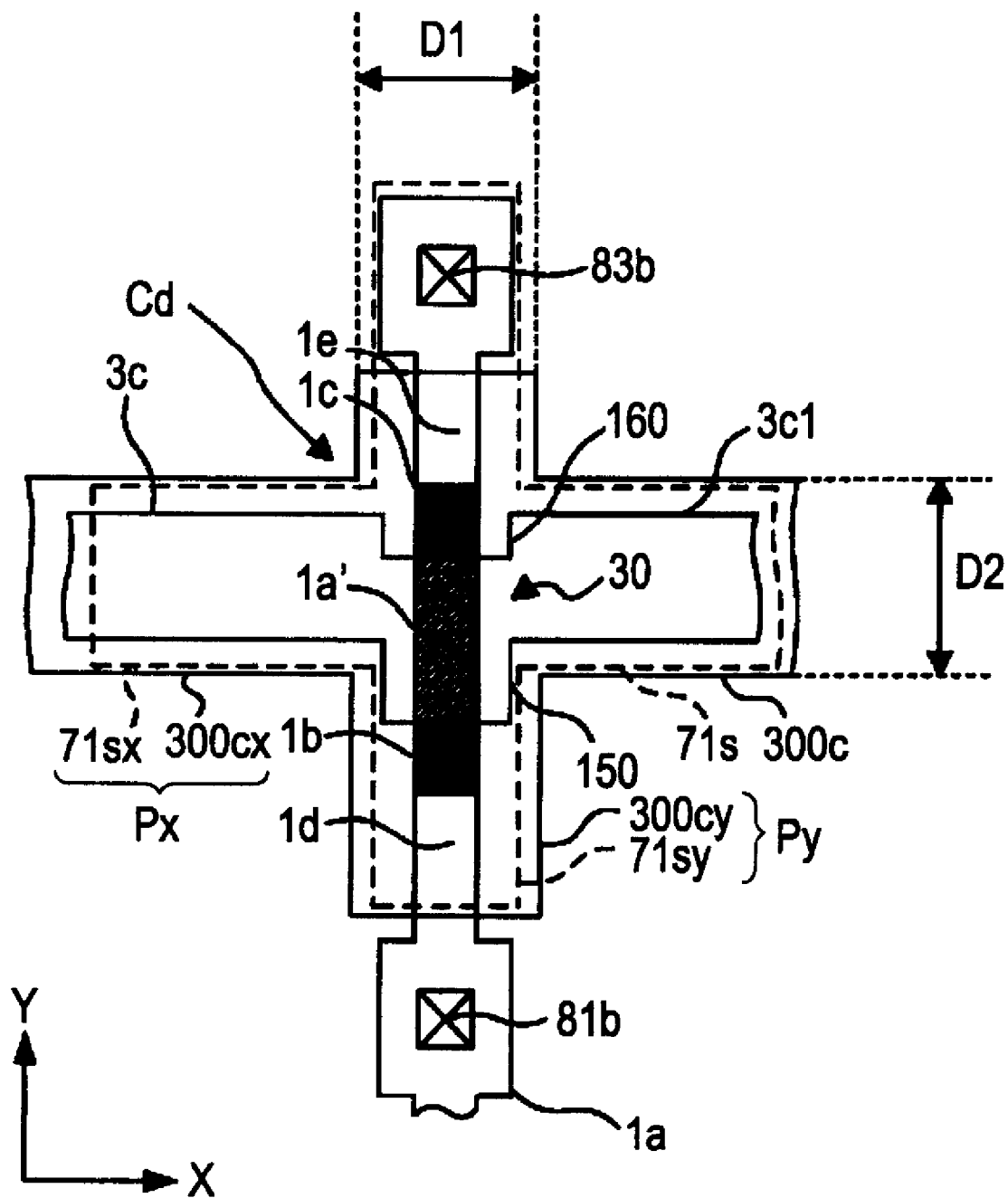
FIG. 16 is a plan view having the same purpose as FIG. 6 in a third embodiment of the invention.

Next, a liquid crystal device according to a third embodiment will be described with reference to FIGS. 14 to 16. FIG. 14 is a plan view having the same purpose as FIG. 4 in the third embodiment. FIG. 15 is a cross-sectional view taken along line XV-XV FIG. 16 is a plan view having the same purpose as FIG. 6 in a third embodiment. In FIGS. 14 to 16, the same components as the components according to the first embodiment shown in FIGS. 1 to 6 are denoted by the same reference numerals and thus the description thereof will be properly omitted.

As shown n FIGS. 14 and 15, the liquid crystal device according to the third embodiment is different from the liquid crystal device according to the first embodiment in that TFTs 30c are included instead of the TFTs 30 according to the first embodiment described with reference to FIGS. 4 and 15, storage capacitors 70c are included instead of the storage capacitors 70a, and scanning lines 3c are included instead of the scanning lines 3a. The liquid crystal device is similar to the liquid crystal device according to the first embodiment, except for the above-described different configuration.

As shown in FIGS. 14 and 15, the TFT 30c includes a semiconductor layer 1a and a portion of the scanning line 3c which becomes a gate electrode. The semiconductor layer 1a includes a channel region 1a' having a channel length along the Y direction, a data line side LDD region 1b and a pixel electrode side LDD region 1c, and a data line side source/drain region 1d and a pixel electrode side source/drain region 1e. The data line side source/drain region 1d is electrically connected to the data line 6a via a contact hole 81b formed in an interlayer insulating film 42, an insulating film 61, an interlayer insulating film 41, and a gate insulting film 2 (in particular, insulating films 2a and 2b). The pixel electrode side source/drain region 1e is electrically connected to a lower capacitive electrode 71s via a contact hole 83b formed in the interlayer insulating film 41 and the gate insulating film 2.

As shown in FIG. 14, in the present embodiment, the plurality of TFTs 30c is positioned such that the directions of the data line side source/drain region 1d and the pixel electrode side source/drain region 1e in a pair of TFTs 30c which are adjacent in the Y direction (that is, the column direction) are reverse in the Y direction, and the contact hole 81b for connecting the data line side source/data region 1d of the pair of TFTs 30c to the data line 6a is shared.

That is, in FIG. 14, if the vertical direction is the Y direction, the pair of TFTs 30c is vertically inverted or vertically mirror-inverted TFTs. The plurality of TFTs 30c which are mirror-symmetrical shares the contact hole 81b for connecting the data line side source/drain region 1d of a $i^{th}$ TFT 30c(i) (i is any one of an odd number or an even number) to the data line 6a and the contact hole 81b for connecting the data line side source/drain region 1d of a i+$1^{th}$ TFT 30c(i+1) to the data line 6a. Accordingly, the data line side source/drain regions of the both sides of the pair of TFT 30c (that is, TFT 30c(i) and the TFT 30c(i+1) are electrically connected to the data line 6a by only one contact hole 81b. That is, compared with the case where the TFT 30c is separately provided to every pixel and the data line side source/drain region 1d is electrically connected to the data line 6a for each TFT 30c, the number of contact holes can be significantly reduced. Accordingly, it is possible to narrow a pitch and to realize the small size and the high precision of the liquid crystal device.

In FIG. 15, the storage capacitor 70c is provided above the TFT 30c on the TFT array substrate 10 with the interlayer insulating film 41 interposed therebetween. The storage capacitor 70c is formed by facing the lower capacitor electrode 71s and the upper capacitive electrode 300c with the dielectric film 75a interposed therebetween.

The upper capacitive electrode 300c is a fixed-voltage side capacitive electrode and the lower capacitive electrode 71s is a pixel voltage side capacitive electrode electrically connected to the pixel electrode side source/drain region 1e of the TFT 30c via the contact hole 83b. The lower capacitive electrode 71s is made of semiconductor such as polysilicon. Accordingly, the storage capacitor 70c has the so-called MIS structure. The lower capacitive electrode 71s is electrically connected to the middle layer 93 via the contact hole 84b penetrating through the interlayer insulating film 42 and the insulating film 61. The lower capacitive electrode 71s functions as a light absorption layer or a light-shielding film interposed between the TFT 30c and the upper capacitive electrode 300c as the upper light-shielding film as well as the pixel voltage side capacitive electrode. The data line 6a is electrically connected to the heavily doped source region 1d via the contact hole 81b penetrating through the interlayer insulating film 41, the insulating film 61 and the second interlayer insulating film 42. An insulating film 61 is partially interposed between the interlayer insulating films 41 and 42.

In FIG. 14, the lower capacitive electrodes 71s are spaced apart from each other in every pixel. Accordingly, the image signals supplied via the data lines 6a are supplied to every pixel by the switching operation of the TFTs 30c. Since the upper capacitive electrode 300c extends over the plurality of pixels along the X direction, the plurality of pixels share the upper capacitive electrode 300*c* and the electrode area thereof is larger than that of the lower capacitive electrode 71*s*. However, since the upper capacitive electrode 300*c* is made of a metal film such as Al, it is possible to suppress the increase of the electrical resistance due to the increase of the electrode area, compared with the case where the upper capacitive electrode 300*c* is made of semiconductor. Accordingly, since it is possible to accomplish the reduction of power consumption at the time of the operation of the liquid crystal display and the high-speed driving of various elements of each pixel, it is possible to obtain an advantage that the deterioration of the responsive property is suppressed when an image is displayed by the liquid crystal device. Such an advantage is not only obtained in the case where the upper capacitive electrode 300*c* extends over the adjacent pixels along the X direction like the present embodiment, but is most obvious in a case where the upper capacitive electrode 300 is formed over the plurality of pixels to occupy a larger area in the image display region 10*a*.

In FIGS. 14 and 16, the storage capacitor 70*c* has a first portion Py which extends along the Y direction from a intersection region in which the first region D1 and the second region D2 intersect, a second portion Px which extends from the intersection region along the X direction, and an intersection portion Cd in which the first portion Py and the second portion Px intersect with each other in the intersection region.

The first portion Py includes a lower capacitive electrode Y-side extending portion 71*sy* of the lower capacitive electrode 71*s*, which extends along the Y direction, an upper capacitive electrode Y-side extending portion 300*cy* of the upper capacitive electrode 300*c*, which extends along the Y direction, and a portion of the dielectric film, which extends between the lower capacitive electrode Y-side extending portion 71*sy* and the upper capacitive electrode Y-side extending portion 300*cy*. The second portion Px includes a lower capacitive electrode X-side extending portion 71*sx* of the lower capacitive electrode 71*s*, which extends along the X direction, an upper capacitive electrode X-side extending portion 300*cx* of the upper capacitive electrode 300*c*, which extends along the X direction, and a portion of the dielectric film, which extends between the lower capacitive electrode X-side extending portion 71*sx* and the upper capacitive electrode X-side extending portion 300*cx*.

In the present embodiment, similar to the liquid crystal device according to the second embodiment, at least a portion of the pixel electrode side LDD region 1*c* overlaps the intersection portion Cd in the intersection region on the TFT array substrate 10 when viewed in plane. The data line side LDD region 1*b* does not overlap the intersection portion Cd. In the intersection portion Cd and the second portion Px, in the case where at least a portion of the pixel electrode side LDD region 1*c* overlaps the intersection portion Cd, it is possible to reduce the light irradiated to the pixel electrode side LDD region 1*c*, compared with the case where the pixel electrode side LDD region 1*c* does not overlap the intersection portion Cd.

As shown in FIGS. 14 and 16, in the present embodiment, in particular, the scanning line 3*c* which is also used as the gate electrode of the TFT 30 has a main line portion 3*c*1 which extends along the X direction in the second region D2, a concave portion 150 which is formed by partially notching the main line portion 3*c*1 such that the main line portion 3*c*1 does not overlap the pixel electrode side source/drain region 1*c* in the intersection region in which the first region D1 and the second region D2 intersect with each other, and a convex portion 160 which protrudes from the main line portion 3*c*1 to the side of the data line side source/drain region 1*d* along the Y direction. Accordingly, the portion of the scanning line 3*c* cannot overlap the pixel electrode side source/drain region 1*c* and can surely overlap the channel region 1*a*' as the gate electrode.

That is, since the scanning line 3 has the concave portion 150, the plurality of pixels arranged along the X direction share the scanning line 3*c* even when the scanning line 3*c* extends along the X direction, and the portion of the scanning line 3*c* cannot overlap the pixel electrode side source/drain region 1*c* and can surely overlap the channel region 1*a*' as the gate electrode. Even when the channel region 1*a* is shifted to the side of the data line side source/drain region 1*d* along the Y direction by a convex portion 160 of the scanning line 3*c*, the portion of the scanning line 3*c* can overlap the channel region 1*a*' as the gate electrode. The gate electrode may be shared with the portion of the scanning line 3*c*, may be provided independent of the scanning line 3*c*, or may be electrically connected to the scanning line 3*c* by a connection portion such as the contact hole.

In FIG. 14, as described above, a pair of TFTs 30*c* shares the contact hole 81*b*, that is, is the vertically mirror-inverted TFTs, the pair of scanning lines 3*c* corresponding to the pair of TFTs 30*c* becomes vertically mirror-inverted scanning lines. That is, the arrangement of the data line side LDD region 1*b* and the pixel electrode side LDD region 1*c* are reverse in the pair of TFTs 30*c* adjacent in the Y direction and the directions of the concave portion 150 and the convex portion 160 are reverse in the pair of scanning lines corresponding to the pair of TFTs 30*c*. By this configuration, it is possible to realize the small size and the high precision of the liquid crystal device and to reduce a display failure such as flicker due to the occurrence of the light leak current.

Electronic Apparatus

Figure 17:
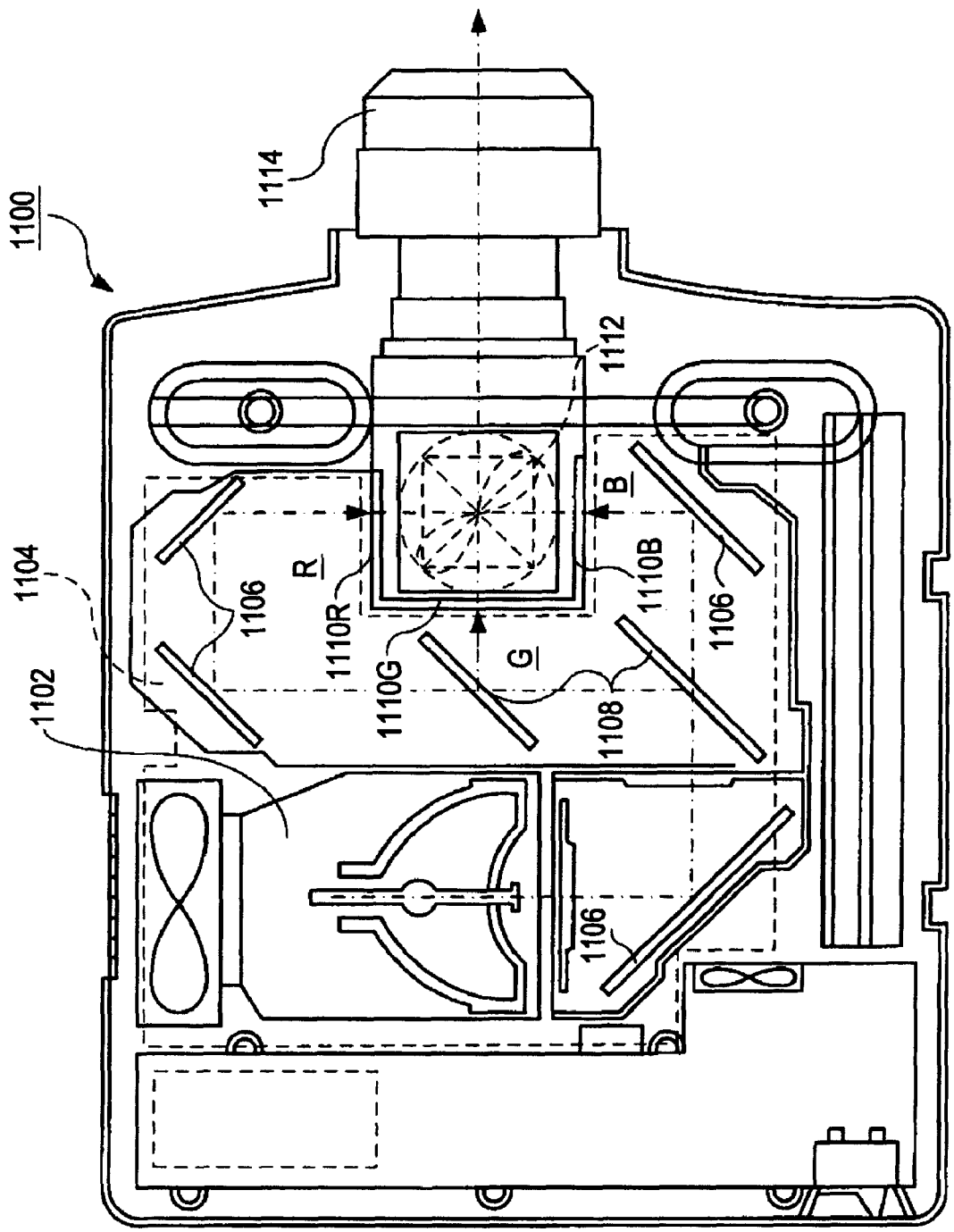
FIG. 17 is a plan view showing the configuration of a projector which is an example of an electronic apparatus using an electro-optical device.

Next, a case where the liquid crystal device which is the electro-optical device is applied to various types of electronic apparatuses will be described. FIG. 17 is a plan view showing the configuration of a projector. Hereinafter, the projector using the liquid crystal device as a light valve will be described.

As shown in FIG. 17, a lamp unit 1102 including a white light source such as halogen lamp is provided in the projector 1100. Projection light emitted from the lamp unit 1102 is divided into three primary colors by four mirrors 1106 and two dichroic mirror 1108 provided in a light guide 1104 and is input to liquid crystal panels 1110R, 1110B and 1110G as light valves corresponding to the primary colors.

The configurations of the liquid crystal panels 1110R, 1110B and 1110G are equal to the above-described liquid crystal device and are driven by the primary signals of R, G and B supplied from an image signal processing circuit. The light modulated by the liquid crystal panels is input to the dichroic prism 1112 in three directions. In the dichroic prism 1112, light of R and B is refracted by 90 degrees and light of G goes straight. Accordingly, as the result of synthesizing the images of the respective colors, a multi-color image is projected on a screen via a projection lens 1114.

Here, in the display images of the liquid crystal panels 1110R, 1110B and 1110G, the display image of the liquid crystal panel 1110G needs to be horizontally inverted with respect to the display images of the liquid crystal panels 1110R and 1110B.

In addition, since light corresponding the primary colors of R, G and B is input to the liquid crystal panels 1110R, 1110B and 1110G by the dichroic mirror 1108, a color filter does not need to be provided.

In addition to the electronic apparatus described in FIG. 17, there are a mobile personal computer, a cellular phone, a liquid crystal television set, a viewfinder-type or direct-view monitor type video tape recorder, a car navigation system, a pager, an electronic organizer, an electronic calculator, a word processor, a workstation, a videophone, a POS terminal, a touch-panel-equipped device. The above-described electronic apparatus can be implemented as a display unit of such exemplary electronic devices.

The invention is applicable to a reflective liquid crystal device (LCOS) in which elements are formed on a silicon substrate, a plasma display panel (PDP), a field-effect display (FED, SED, or the like), an organic EL display, a digital micro-mirror device (DMD), an electromigration device or the like, in addition to the liquid crystal device described in the above-described embodiments.

The invention is not limited to the above-described embodiments and may be properly changed without departing from the spirit and scope of the invention as defined by the appended claims and the whole specification. A substrate for an electronic-optical device, an electro-optical device including the substrate for the electro-optical device, and an electronic apparatus including the electro-optical device with the change are included in the technical range of the invention.

What is claimed is:

1. An electro-optic device substrate comprising:
   a substrate;
   a plurality of data lines and a plurality of scan lines intersecting with each other over the substrate;
   pixel electrodes formed in pixels that correspond to the intersections between the data lines and the scan lines and that constitute a display area of the substrate;
   transistors disposed in non-opening areas separating opening areas of the respective pixels, one of the transistors including:
   a semiconductor layer having a channel region with a channel length following one direction of the display area,
   a data line-side source-drain region electrically connected to a corresponding data line,
   a pixel electrode-side source-drain region electrically connected to a corresponding pixel electrode,
   a first junction region between the channel region and the data line-side source-drain region, and
   a second junction region between the channel region and the pixel electrode-side source-drain region; and
   light shielding sections above the semiconductor layers, one of the light shielding sections including:
   a main section that extends in another direction intersecting the one direction and that covers the channel region,
   a first section that extends from the main section following the one direction and that covers the first junction region, the first section including a first light shielding portion and a second light shielding portion, the first light shielding portion and the second light shielding portion being opposed to each other with the first junction region therebetween, and
   a second section that extends from the main section in the one direction, that covers the second junction region, the second section including a third light shielding portion and a fourth light shielding portion, the third light shielding portion and the fourth light shielding portion being opposed to each other with the section junction region therebetween, the third light shielding portion and the fourth light shielding portion being formed wider than the first light shielding portion and the second light shielding portion, respectively, in the another direction and overlapping adjacent pixel electrodes.

2. The electro-optic device substrate according to claim 1, the second junction region being an LDD region.

3. The electro-optic device substrate according to claim 1, the light shielding section being disposed directly above the transistor.

4. The electro-optic device substrate according to claim 1:
   the light shielding section being a capacitive element having a pair of capacitive electrodes and a dielectric film sandwiched between the pair of capacitive electrodes, and
   the capacitive element holding an electric potential of the pixel electrode when an image signal is supplied to the pixel electrode through the data line.

5. The electro-optic device substrate according to claim 4, at least one of the pair of capacitive electrodes including an electro-conductive light shielding film.

6. An electro-optic device comprising the electro-optic device substrate according to claim 1.

7. An electronic apparatus comprising the electro-optic device according to claim 6.

8. An electro-optic device substrate according to claim 1, wherein the first section is narrower than the data line in the another direction.

* * * * *

UNITED STATES PATENT AND TRADEMARK OFFICE
CERTIFICATE OF CORRECTION

| | |
|---|---|
| PATENT NO. | : 8,168,982 B2 |
| APPLICATION NO. | : 12/567268 |
| DATED | : May 1, 2012 |
| INVENTOR(S) | : Tatsuya Ishii |

Page 1 of 1

It is certified that error appears in the above-identified patent and that said Letters Patent is hereby corrected as shown below:

Title Page, Item (*) Notice should read

This patent is subject to a terminal disclaimer.

Signed and Sealed this
Fourteenth Day of August, 2012

David J. Kappos
*Director of the United States Patent and Trademark Office*